(12) United States Patent
Renn

(10) Patent No.: US 6,636,676 B1
(45) Date of Patent: Oct. 21, 2003

(54) PARTICLE GUIDANCE SYSTEM

(75) Inventor: Michael J. Renn, Hudson, WI (US)

(73) Assignee: Optomec Design Company, Albuquerque, NM (US)

( * ) Notice: Subject to any disclaimer, the term of this patent is extended or adjusted under 35 U.S.C. 154(b) by 0 days.

(21) Appl. No.: 09/584,997

(22) Filed: Jun. 1, 2000

Related U.S. Application Data

(63) Continuation-in-part of application No. 09/408,621, filed on Sep. 30, 1999, now abandoned
(60) Provisional application No. 60/102,418, filed on Sep. 30, 1998.

(51) Int. Cl.$^7$ ................................................ G02B 6/02
(52) U.S. Cl. ......................... 385/125; 385/147; 385/11
(58) Field of Search ................................ 385/125, 147, 385/134, 11; 209/301; 219/121.66; 427/180; 372/69, 70, 72, 73

(56) References Cited

U.S. PATENT DOCUMENTS

| | | | |
|---|---|---|---|
| 3,808,432 A | | 4/1974 | Ashkin ........................ 250/251 |
| 3,808,550 A | | 4/1974 | Ashkin ........................... 176/1 |
| 4,016,417 A | | 4/1977 | Benton ........................ 250/251 |
| 4,810,658 A | * | 3/1989 | Shanks et al. ............... 436/172 |
| 4,909,080 A | * | 3/1990 | Kikuta et al. ............. 73/290 V |
| 5,009,102 A | * | 4/1991 | Afromowitz .................. 73/590 |
| 5,170,890 A | * | 12/1992 | Wilson et al. ............... 209/301 |
| 5,677,196 A | * | 10/1997 | Herron et al. ............... 436/518 |

OTHER PUBLICATIONS

Ashkin, A., "Acceleration and Trapping of Particles by Radiation Pressure", *Physical Review Letters*, Jan. 26, 1970, pp. 156–159, vol. 24, No. 4, The American Physical Society.
Ashkin, A., et al., "Optical trapping and manipulation of single cells using infrared laser beams", *Nature*, Dec. 24/31, 1987, pp. 769–771, vol. 330, London, Great Britain.
Renn, M.J., et al., "Laser Guidance and Trapping of Mesoscale Particles in Hollow–Core Optical Fibers", *Physical Review Letters*, Feb. 15, 1999, pp. 1574–1577, vol. 82, No. 7, The American Physical Society.
Renn, M.J., et al., "Particle manipulation and surface patterning by laser guidance", *Journal of Vacuum Science & Technology B*, Nov./Dec. 1998, pp. 3859–3863, vol. 16, No. 6, American Vacuum Society.

\* cited by examiner

*Primary Examiner*—Brian Healy
(74) *Attorney, Agent, or Firm*—Jeffery D. Myers

(57) ABSTRACT

Methods and apparatus are disclosed for using a beam of energy, specifically laser light (46), to transport, suspend or trap non-atomic size particles (59) within a hollow-core optical fiber (50), manipulating the particles (59) along the fiber (50) over distances and depositing them on a substrate (58). A laser generates a beam (46) focused on a fiber (50) entrance (56). A source (54) delivers particles (52) to the entrance (56). Particles (52) are drawn into the beam (46) and propelled through the core (48) of the fiber (50). Forces ($F_1$–$F_4$) on a particle (12) generated by reflection, absorption and refraction of laser light (20) keep the particle (12) close to the fiber's center and propel it along the fiber's length. A variety of micron-size particles, including solids, solid dielectrics, semiconductors, liquids, aerosols and living cells are conveyed. The invention is adapted to direct-writing of micron-sized features (66–74) on surfaces, for example, microcircuits and microcircuit components for "smart" credit cards and biological implants, to recording emission spectra of trapped particles and to many other such uses. Deposited material (172) is treated by laser light (174) by particle melting, decomposition, sintering or other chemical and mechanical reactions caused by laser interaction with the particle. Resulting, treated depositions have desirable mechanical and electrical properties for electronics and micro-electronic-mechanical system applications.

24 Claims, 16 Drawing Sheets

PARTICLE GUIDANCE SYSTEM

CROSS-REFERENCES TO RELATED PATENT APPLICATIONS & CLAIMS FOR PRIORITY

The present application is a continuation-in-part application of U.S. patent application Ser. No. 09/408,621, filed on Sep. 30, 1999, abandoned entitled "Laser-Guided Manipulation of Non-Atomic Particles", to Michael J. Renn et al., which application claimed the benefit of priority under Section 120 of the United States Code of Laws for any and all subject matter which was commonly disclosed in that application and in U.S. patent application Ser. No. 60/102,418, filed on Sep. 30, 1998, entitled *Laser-Guided Manipulation of Non-Atomic Particles,* to Michael J. Renn et al.

This invention was made with Government support under Contract/Grant N000 14-99-1-0258 awarded by the Department of the Navy. The Government has certain rights in the invention.

INTRODUCTION

The title of the invention is *Particle Guidance System.* The inventor is Michael J. Renn of 9634 MacAllan Road NE, Albuquerque, N. Mex. 87109. The inventor is a citizen of the United States of America.

FEDERALLY SPONSORED RESEARCH OR DEVELOPMENT

None.

FIELD OF THE INVENTION

The present invention relates generally to the field of optical guides. More specifically, one embodiment of the present invention relates to methods and apparatus for confining a non-atomic particle in a laser beam. The particle, which is confined in the laser beam, is guided through a hollow core optical fiber for study, measurement or deposition. The process is used to produce three-dimensional structures.

BACKGROUND OF THE INVENTION

Methods for transporting atomic sized particles using radiation and pressure-based processes are known in the art, and have been used to precisely and non-mechanically manipulate particles. An atom placed in an optical beam is attracted to or repelled from regions of high intensity, depending whether the atom can be polarized at the optical frequency. Laser-induced optical forces arise when particles are polarized in intense optical fields. Laser guidance of non-atomic particles utilizes these optical forces arising generally from the deflection and scattering of light. These forces have been used in a number of optical traps. For example, "optical tweezers" allow dielectric particles to be trapped near the focal point of a tightly focused, high-power laser beam. These optical tweezers are used to manipulate biological particles, such as viruses, bacteria, microorganisms, blood cells, plant cells, and chromosomes. Optical tweezers also allow a user to manipulate small, particles in an aqueous medium, though they do not allow the user to perform the same manipulation in the air. Optical traps for atoms are used in investigations of ultra-cold collisions and of the collective effects of trapped atoms.

Most known techniques for trapping atoms in a tightly focused laser beam, and for transporting atoms together with the laser beam have limitations, since the trapping occurs only in a small region near the focal point of the laser. As a result, imaging and detecting devices utilizing optical traps must be built around a sample chamber, which often limits the size of the chamber in the devices. Since trapping and transporting particles occurs inside the chamber, then these imaging and detection devices require the laser beam to be steered from outside the chamber. Moreover, optical trapping forces are typically not large enough to trap particles in the laser beam if the background medium in the chamber is turbulent or convective. Furthermore, when conventional optical tweezers are employed, only a substantially transparent particle possesses the optical qualities that are required to enable the axial force exerted on the particle in the laser beam to trap the particle inside the beam.

The technique of guiding atoms through a hollow core optical fiber was devised to improve previous procedures for manipulating particles through various media over long distances, and for transporting cold atoms from one vacuum system to another. Fiber-guided atoms are deflected from the inner surface of the fiber by light also guided in the fiber. Optical forces induced by the laser light guided in a fiber may be used to reflect atoms from the inner wall of a hollow core optical fiber. In this setting, laser light is coupled to the lowest-order grazing incidence mode, and the laser frequency is tuned to the red side. Atoms are attracted to the high intensity region at the center of the fiber. Atoms guided in a fiber this way undergo a series of loss-less oscillations in a transverse plane, and unconstrained motion in an axial direction.

While the method of guiding atoms through optical fibers was a step forward in developing means for manipulating and transporting particles from a source to a desired destination, an inherent limitation of this previous method was the atomic size of a manipulated particle. Because of an atom's size, the wavelength of the guiding laser beam had to be close to that of an atomic transition, and the manipulation itself could be performed only in a vacuum, requiring a special vacuum chamber. The process of atomic particle transportation is limited to moving a few kinds of materials, essentially ruling out manipulating and guiding atoms of a broad range of materials. In previous nano-fabrication processes, those which guide atoms and precisely deposit them on a substrate to form nanometer size features, high throughput is not achieved.

It is desirable in industrially-applicable techniques to achieve high-rate depositions of a wide range of materials having particle sizes many times greater than single atoms. The need exists to provide a method and apparatus for manipulating and guiding microscopic (non-atomic) particles through a suitable medium along straight and bent trajectories. It is also desirable to provide a method and apparatus capable of guiding particles of a wide range of materials in non-vacuum environment and depositing the particles on various kinds and shapes of substrates.

The problem of providing a method and apparatus for optimal control of diverse material particles ranging in size from individual or groups of atoms to microscopic particles used to fabricate articles having fully dense, complex shapes has presented a major challenge to the manufacturing industry. Creating complex objects with desirable material properties, cheaply, accurately and rapidly has been a continuing problem for designers. Producing such objects with gradient or compound materials could provide manufacturers with wide-ranging commercial opportunities. Solving these problems would constitute a major technological advance, and would satisfy a long felt need in the part fabrication industry.

SUMMARY OF THE INVENTION

The present invention provides a solution to the problems encountered by previous particle manipulation methods. The present invention provides methods and apparatus for laser guidance of micron-sized and mesoscopic particles. The invention also furnishes methods and apparatus which use laser light to trap particles within the hollow region of a hollow-core optical fiber. This embodiment of the invention enables the transportation of particles along the fiber over long distances. The present invention also includes processes for guiding a wide variety of material particles, including solids and aerosol particles, along an optical fiber to a desired destination.

The present invention further includes methods and apparatus for guiding particles in ambient, aqueous or gaseous environments, including an inert gas environment, which may be desirable for the fabrication of objects.

The invention may also be employed to deliver liquid and solid particles to a substrate using a laser to guide particles in hollow-core optical fibers after extracting the particles from source backgrounds. This method allows a user to fabricate micron-size surface structures, such as electrical circuits and micro-electronic-mechanical devices, on a virtually unlimited variety of substrates, including semiconductors, plastics, metals and alloys, ceramics and glasses. The particles deposited on such substrates can be metals or alloys, semiconductors, plastics, glasses, liquid chemical droplets and liquid droplets containing dissolved materials or colloidal particles.

Another embodiment of the invention may be used as a fiber optic particle guide for non-contact, non-mechanical manipulation of mesoscopic particles. Such particles include those of biological origin such as bacteria, viruses, genes, proteins, living cells and DNA macromolecules. The particles can also be inorganic, such as glasses, polymers and liquid droplets.

Another embodiment of the present invention provides a method of controlling and manipulating non-atomic particles by trapping them within an optical fiber anywhere along the length of the fiber. A laser beam may be directed to an entrance of a hollow-core optical fiber by a focusing lens. A source of particles to be guided through the fiber provides a certain number of particles near the entrance to the fiber. The particles are then drawn into the hollow core of the fiber by the focused laser beam, propagating along a grazing incidence path inside the fiber. Laser induced optical forces, generated by scattering, absorption and refraction of the laser light by a particle, trap the particle close to the center of the fiber and propels it along. Virtually any micron-size material, including solid dielectric, semiconductor and solid particles as well as liquid solvent droplets, can be trapped in laser beams, and transported along optical fibers due to the net effect of exertion of these optical forces. After traveling through the length of the fiber, the particles can be either deposited on a desired substrate or in an analytical chamber, or subjected to other processes depending on the goal of a particular application.

In another embodiment of the present invention, the particle manipulation methods are used to levitate particles inside a hollow-core fiber. In this method, particles or liquid droplets captured by a tightly focused laser beam are drawn into a vertically positioned fiber. After a certain distance inside the fiber, the propelling axial optical force pulling the particle up is balanced by the gravitational force acting on the particle. Such a balance of forces makes the particle levitate in an equilibrium position, allowing the estimation of the magnitude of the propelling force. Similarly, if a particle is trapped in a horizontally positioned optical fiber by two laser beams entering the fiber from two opposing ends of the fiber, the particle will levitate in a certain equilibrium position inside the fiber. Varying the intensity of the lasers allows one to estimate the magnitude of the force confining the particle in the center of the fiber.

The invention may also be utilized to transport and pattern aerosol particles on a substrate. By directing particles along the fiber and onto the substrate, micron-size features of desirable shape can be fabricated by directed material deposition (DMD) of these particles. Such features are built up by continual addition of particles, which are fused together on the substrate by various techniques including "in-flight" melting of the particles and subsequent coalescence of molten droplets on the substrate. This embodiment also offers the ability to simultaneously deposit solid particles and liquid "precursors," where the liquids serve to fill the gaps between solid particles. A precursor is any material that can be decomposed thermally or chemically to yield a desired final product. Coalescence of liquid precursors on the substrate and subsequent decomposition by laser heating to form a final product on the substrate and sintering of the deposited material by laser, or chemical binding are additional techniques made possible by the invention. Another technique that is enabled by the invention is the heating of a substrate, as in conventional CVD processes.

An appreciation of other aims and objectives of the present invention may be achieved by studying the following description of preferred and alternate embodiments and by referring to the accompanying drawings.

A DETAILED DESCRIPTION OF PREFERRED & ALTERNATIVE EMBODIMENTS

Background of the Invention

Optical forces arise when particles are polarized in intense optical fields. These forces result from the reflection and refraction of light at the interface of a particle's surface and its environment. When the size of a particle is large compared to the wavelength of the incident light, the forces acting on the particle can be described in a geometrical ray approximation.

The following symbols and abbreviations used throughout this Specification are explained below:

| | |
|---|---|
| mW — milliwatt (laser power) | $\mu$m — micrometer (length) |
| mm — millimeter (length, wavelength) | $\lambda$ — wavelength |
| nm — nanometer (length) | $\eta$ — index of refraction |

Figure 1:
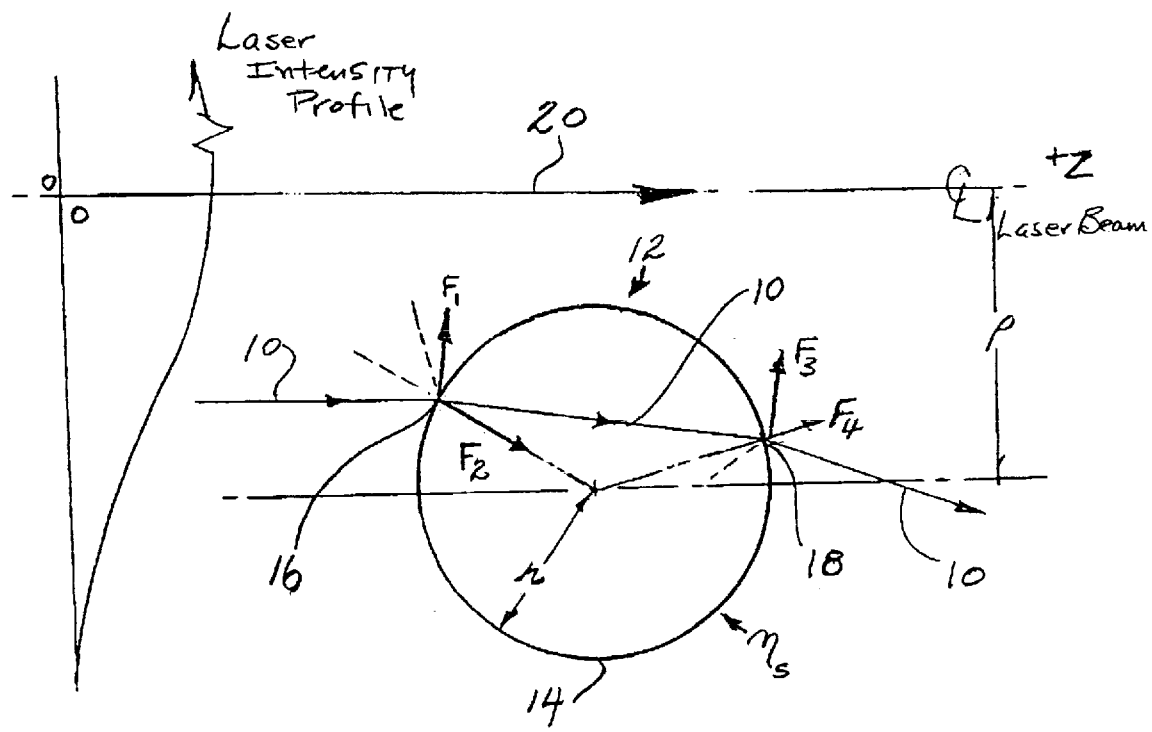
FIG. 1 is a schematic representation of optical forces exerted on a particle by a laser beam.

As shown in FIG. 1, a single optical laser ray 10 from a laser beam is shown striking a sphere 12 having a refractive index $\eta$s larger than a refractive index $\eta$m of the surrounding medium. In this example, sphere 12 is a dielectric sphere made of an optically transparent material, so it is transparent to ray 10. Incident on a surface interface 14, ray 10 undergoes partial reflection and refraction. A portion of incident ray 10 reflected at interface 14 is known as radiation pressure. The first time a portion of ray 10 is reflected is when ray 10 enters sphere 12 at an entrance point 16, creating radiation pressure force F2, perpendicular to the surface of sphere 12 and directed toward the center of the sphere. The second time a portion of ray 10 is reflected is when the ray exits sphere 12 at an exit point 18, creating radiation pressure force F4, also perpendicular to the surface of sphere 12, but directed outwardly. Portions of ray 10 which are refracted at the surface of sphere 12 when the ray enters and exits the sphere at points 16 and 18 create forces F1, and F3 respectively. Force F1 is perpendicular to the direction of the refracted ray 10 as it propagates inside sphere 12. Similarly, force F3 is perpendicular to the direction of the once-again refracted ray 10 as it propagates after exiting the sphere 12. The sum of the forces F1 through F4, in addition to forces arising from multiple reflections inside the sphere, gives the total force acting on sphere 12 from the ray 10.

If total forces from all possible rays incident on sphere 12 are calculated and added up, the summation will give the two resulting net forces. The first net force is a confinement force, also known as a gradient force, acting in a radial direction. This direction is toward an increase of laser beam intensity. The second net force, known as a radiation pressure force, acts along the axis z of the laser beam and results in propelling sphere 12 along the direction of laser propagation. Consequently, optical forces exerted by a laser beam on sphere 12 simultaneously pull the sphere toward the center of the laser beam and accelerate the sphere along the direction of propagation of the beam. It is important to note that the mechanism of guiding non-atomic particles through optical fibers utilized in the present invention is different from that of guiding atoms. Most notably, optical forces causing confinement and propulsion of a non-atomic particle in a fiber are based on non-resonant scattering of light, as described with regard to FIG. 1. To the contrary, atomic laser guidance is based on resonant interactions between the laser field and the atom.

Optical Forces Acting on a Particle in a Laser Field

To obtain a magnitude of radiation pressure and gradient forces sufficient to propel a particle, high intensity laser fields are required. These are normally achieved in highly focused laser beams. As a result, optical forces, sufficient to trap and propel particles occur only near the laser beam "waist" ($w_0$) in a hollow core of an optical fiber. The beam waist ($w_0$) is the radial distance from the center of the beam to where the beam energy declines to $1/e$. Within the hollow core, a high intensity region of the beam extends along the length of the fiber, providing for propulsion as well as confinement of the particles inside the hollow fiber. When a laser beam propagates along the fiber, the beam does not stray but travels along the length of the fiber, making it possible to carry the particle along the fiber. Although one of the preferred embodiments of the invention utilizes a laser to guide particles, any high intensity field of controllable radiation or beam of energy may be used to practice the invention.

Figure 2:
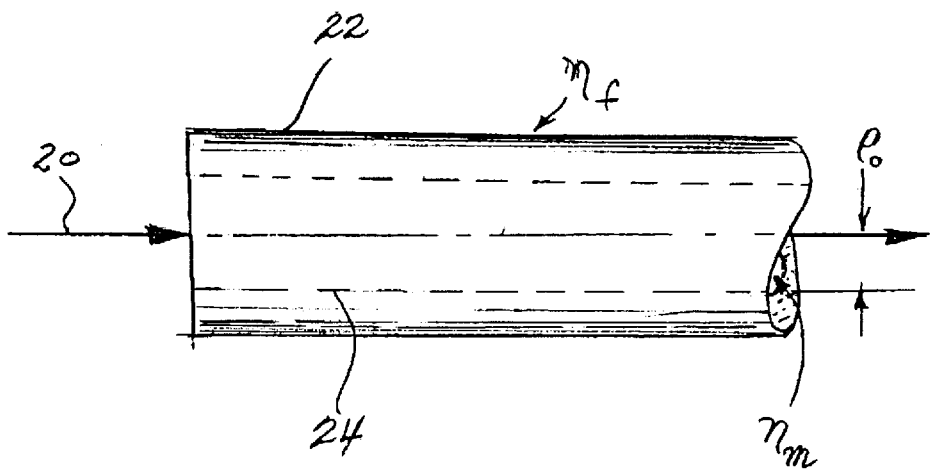
FIG. 2 is a side view of a hollow-core optical fiber.

The radial profile of the lowest order optical mode coupled to a hollow fiber is represented by a zero$^{th}$ order Bessel function $J_0(X\rho)$, where $X=2.4/\rho_0$, where $\rho_0$ is the radius of a hollow core region 24 of the fiber as shown in FIG. 2. The lowest loss grazing-incidence mode has an intensity I at radial distance $\rho$ from fiber centerline and axial distance z along the fiber given by the following equation:

$$I(\rho,z) = I_0 (J_0(X\rho))^2 \exp(-z/z_0) \qquad \text{Equation (1)}$$

where $I_0$ is the peak intensity of the laser field at the fiber center where $\rho=0$, and $z_0$ is a beam decay length, given by:

$$z_0 = 6.8 \ (\rho_0^3/\lambda^2)((v^2-1)^{-1/2}/(v^2+1)) \qquad \text{Equation (2)}$$

where v is the ratio of fiber wall refractive index $\eta$f to the hollow core refractive index $\eta$m of the medium in the hollow core region, $\lambda$ is the laser wave length in the hollow region, z is the distance from the beginning of the fiber. It follows from equation (1), that the intensity of the laser field has a maximum at the center of the fiber where $\rho=0$ and slowly decreases along the length of the fiber as $\exp(-z/z_0)$. Beam decay length z sets the limit of the distance which particles can be guided. In general, z is calculated using equation (2) for a specific fiber geometry, laser wave length, and refractive indices of the fiber core and walls. An estimate of equation (2) provides a practical limit to a guidance distance of up to 100 inches.

Figure 3:
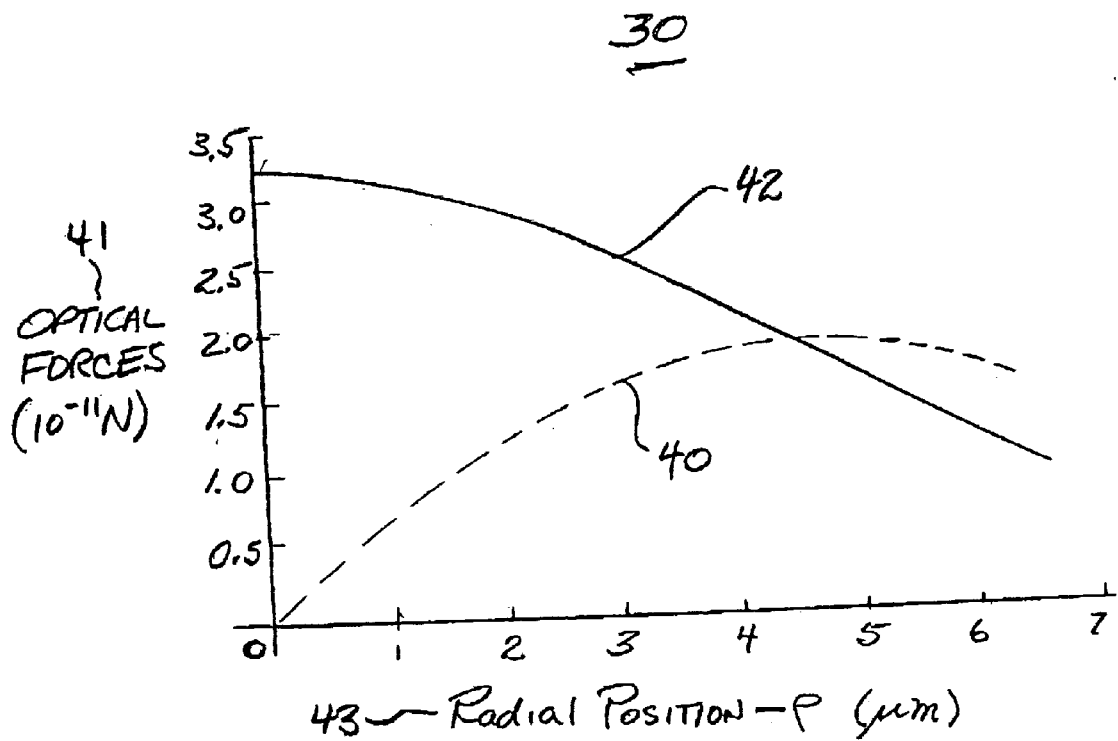
FIG. 3 is a graph showing the dependence of optical forces on a radial position of a particle from the center of a laser beam.

A chart 30 of optical forces 41 in units of $10^{-11}$ Newtons on a dielectric particle having a radius r larger than the wavelength $\lambda$ of a laser is shown in FIG. 3. The graph depicts radial dependence of the axial scattering force 40 and radial gradient force 42 on a 7 $\mu$m diameter polystyrene sphere ($\eta$s=1.59) near the entrance of a water-filled fiber using geometric ray formalism and equation (1) for the intensity profile calculations.

The experimental conditions were the following: A 3.6 mm diameter, 240 milliwatt (mW) laser beam was coupled with 90% efficiency into a 20 μm diameter fiber. As seen in FIG. 3, a radial gradient force 40 increases nearly linearly with small displacements 43 from the fiber center indicating a restoring force drawing the particle toward the high intensity central region of the fiber. An axial force 42 in FIG. 3 is nearly constant for small displacements 43 from the center.

From a theoretical basis and experimental results described above, it follows that if an intense laser beam inside a hollow core fiber has a proper profile and if the trapped particle is damped by the fluid inside the fiber, the particle is confined inside the laser beam and can be transported with the beam without bouncing off the inside walls of the fiber. The size of the particles capable of being guided that way can vary from about 50 nanometers (nm) diameter to about 10 micrometers (μm) diameter. The higher the refractive index of a particle, the larger optical forces are exerted on the particle, and, consequently, the easier it is to manipulate and transport such a particle.

Materials Manipulated

Besides polystyrene spheres and water droplets, other substances guided through the fibers were salt, sugar, potassium iodide (KI), cadmium telluride (CdTe), silicon (Si) and germanium (Ge) crystals, gold (Au) and silver (Ag) particles with sizes ranging from about 10 nm to about 10 μm. A 0.5 watt laser and a 17 μm inner-diameter, air-filled fiber were used. Listed in Table 1 and 2 are the materials manipulated by laser guidance on a variety of substrates. Since metal particles, such as Au and Ag, for example, usually reflect light well and absorb very little light, larger metal particles can be transported along the hollow-core fibers faster than less reflective materials.

TABLE ONE

Materials Manipulated

| | |
|---|---|
| Metals | Au, Ag, Pd, Rh, Pt |
| Dielectrics | Glass, BaTiO$_3$, Al$_2$O$_3$ |
| Semiconductors | Si, Ge, CdS, In$_2$O$_3$ |
| Liquids | H$_2$O, acids, bases, solvents, salt solutions, |
| Plastics | Polystyrene |
| Biological | Embryonic nerve and glial cells, bacteria, microtubules |

Substrates used:

Glass, Ceramic, Plastic, Paper, Si, Polyimide
Line Dimensions: 3 μm ± 0.5 μm

The use of hollow core fibers allows manipulation of a wide variety of particles and virtually opens up a non-contact, non-mechanical way of transporting numerous materials. Living cells can be manipulated and guided through the fibers in liquid environments. Examples of the results of fiber guiding for several types of dielectric particles are shown in FIGS. 7a–d and discussed later. Each image of a short section of fiber in FIGS. 7a–7d is captured on a CCD camera. FIGS. 7a–7c show snapshots of polystyrene spheres guided in a water-filled fiber. FIG. 7d shows an example of a particle guided in an air-filled fiber. The track of scattered light in FIG. 7d indicates the trajectory of a 1 μm water droplet in a 20 μm diameter fiber.

Direct-Write Patterning of Surfaces

One of the many applications of particle laser guidance is direct-write patterning of surfaces, in which optical forces transport particles through hollow core optical fibers and deposit the transported particles on surfaces. In the laser guidance and surface patterning apparatus 44 depicted in FIG. 4, laser light 46 is focused into the hollow region 48 of a hollow core fiber 50 and guided in a low order grazing incidence mode. Aerosol particles 52 created by a "nebulizer" 54 (a device which reduces a liquid to fine mist) and situated near the fiber entrance 56 are funneled into the hollow region 48 by optical gradient and scattering forces, and then guided to a substrate 58. For best results, substrate 58 is usually placed between 10 μm and 300 μm from the end of the fiber, because at larger distances the optical forces decrease rapidly and cannot continue to confine the particles.

Figure 4:
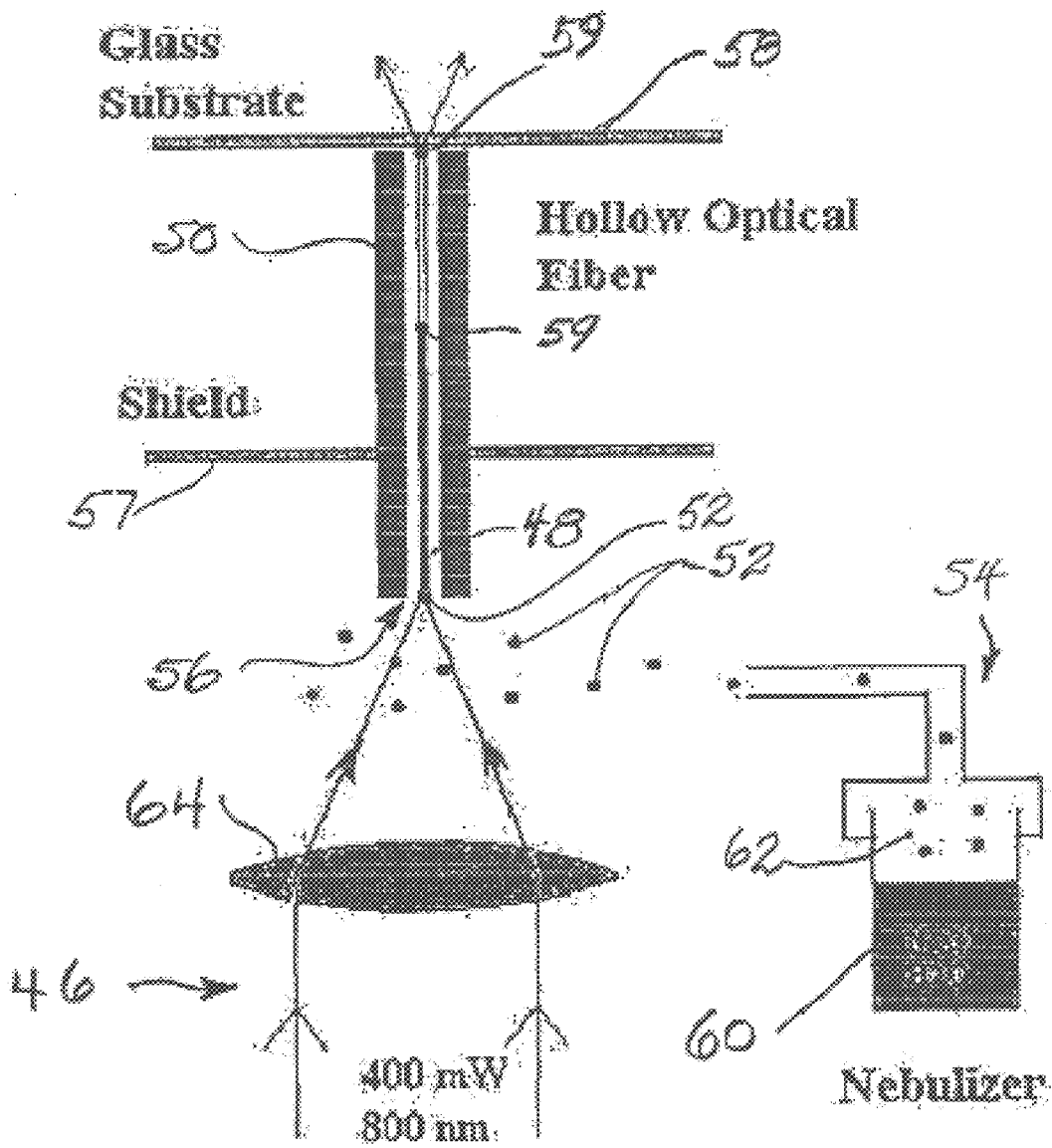
FIG. 4 is a schematic representation of a laser guidance apparatus.

The material used for surface patterning is usually either dissolved or suspended in a liquid 60, such as sodium chloride (NaCl) dissolved in water (H$_2$O) in the experiment of FIG. 4. The material can be a crystalline substance, for example barium titanate (BaTiO$_3$), a common capacitor material for electronic applications. It may be a dissolved precursor material, such as silver nitrate, which can be decomposed to silver as the deposited material by heating while inside the laser beam during transportation. It is contemplated that many other materials are capable of being transported to a surface and deposited on the surface. When an aerosol mist 62 is generated by the nebulizer 54, the mist is directed into the laser beam 46 near an entrance 56 of the hollow fiber 50. Laser axial scattering forces and radial gradient forces at the entrance 56 draw the aerosol particles 52 toward the center of the laser beam 46 and propel them into the fiber 50. As the aerosol particles travel through the fiber 50, excess solvent evaporates, leaving behind solid crystal particles 59. Such drawing technique has general application. A wide variety of materials can be drawn into a laser beam 46. Precursors for virtually every material used in electronics are known and available.

Coupling the laser beam 46 into the fiber 50 is accomplished with the help of a lens 64 that matches the fiber mode radius to the Gaussian beam waist. In one of the embodiments of the apparatus 44, for a fiber having an inner diameter of 20 μm, a 0.05 numerical aperture (NA) lens gives a coupling efficiency better than 90% into the lowest order mode. It is possible to use lenses with a larger NA, which lenses excite rapidly decaying high-order modes. Considerable care must be given to angular alignment of the incident laser light to the fiber. A misalignment of about 1 degree excites high-order modes and results in the guided particles hitting the inside wall of the fiber.

Figure 5:
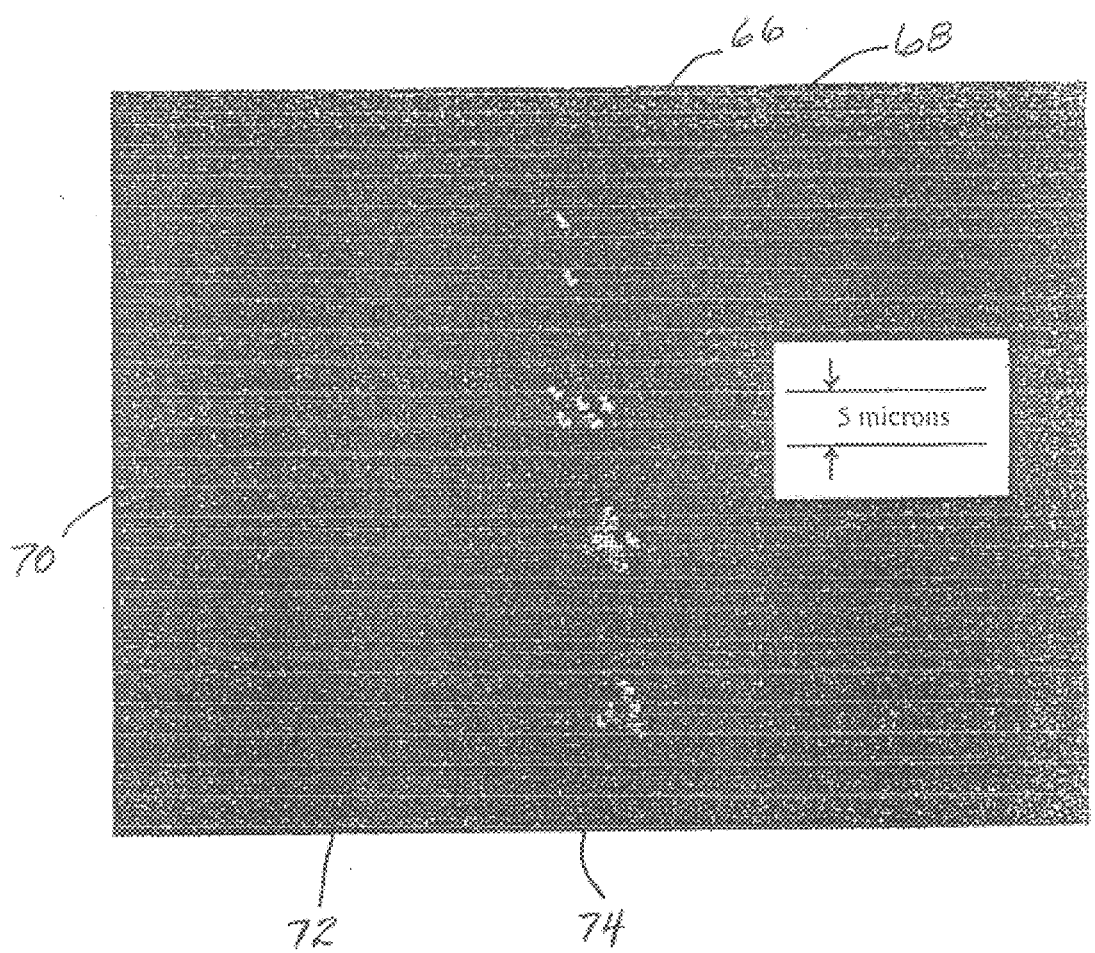
FIG. 5 is a microscopic picture of a sodium chloride (NaCl) deposition example.
Figure 6A:
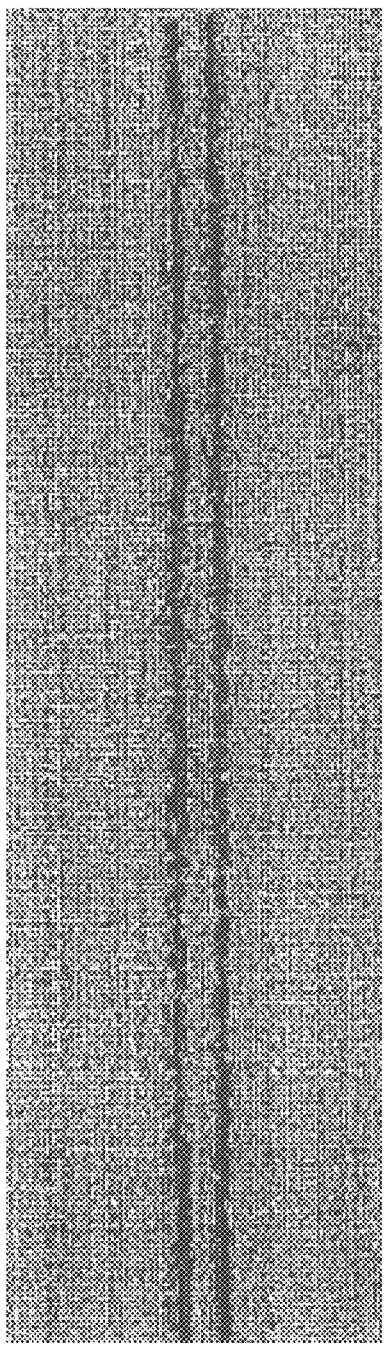
FIGS. 6(a)–(e) are microscopic pictures of crystal deposition for barium titanate ($BaTiO_3$), indium oxide ($In_2O_3$), silver (Ag), aluminum nitrate ($Al(NO_3)_3$) and aluminum oxide ($Al_2O_3$), respectively.
Figure 6A:
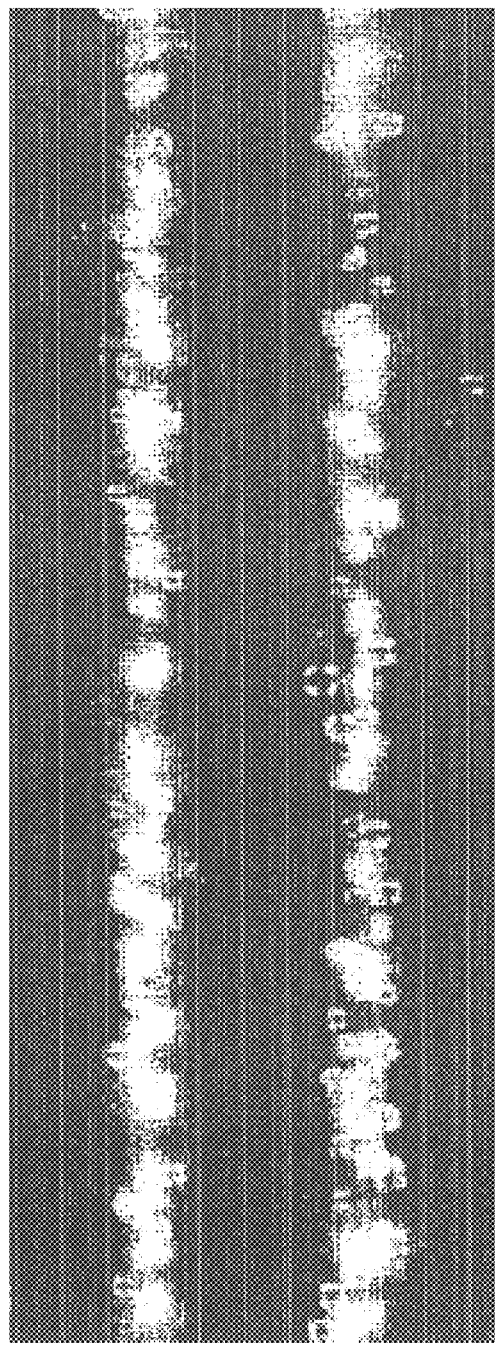
Figures 6B, 6C:
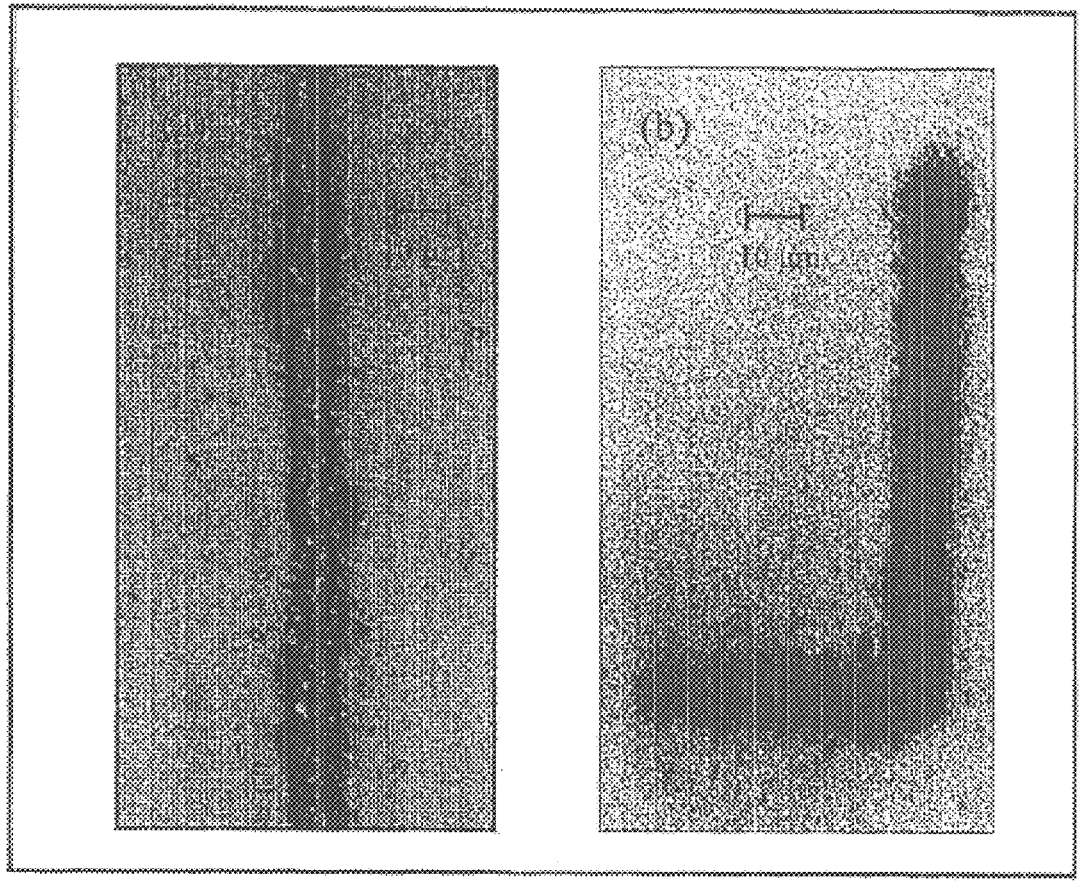
Figures 6D, 6E:
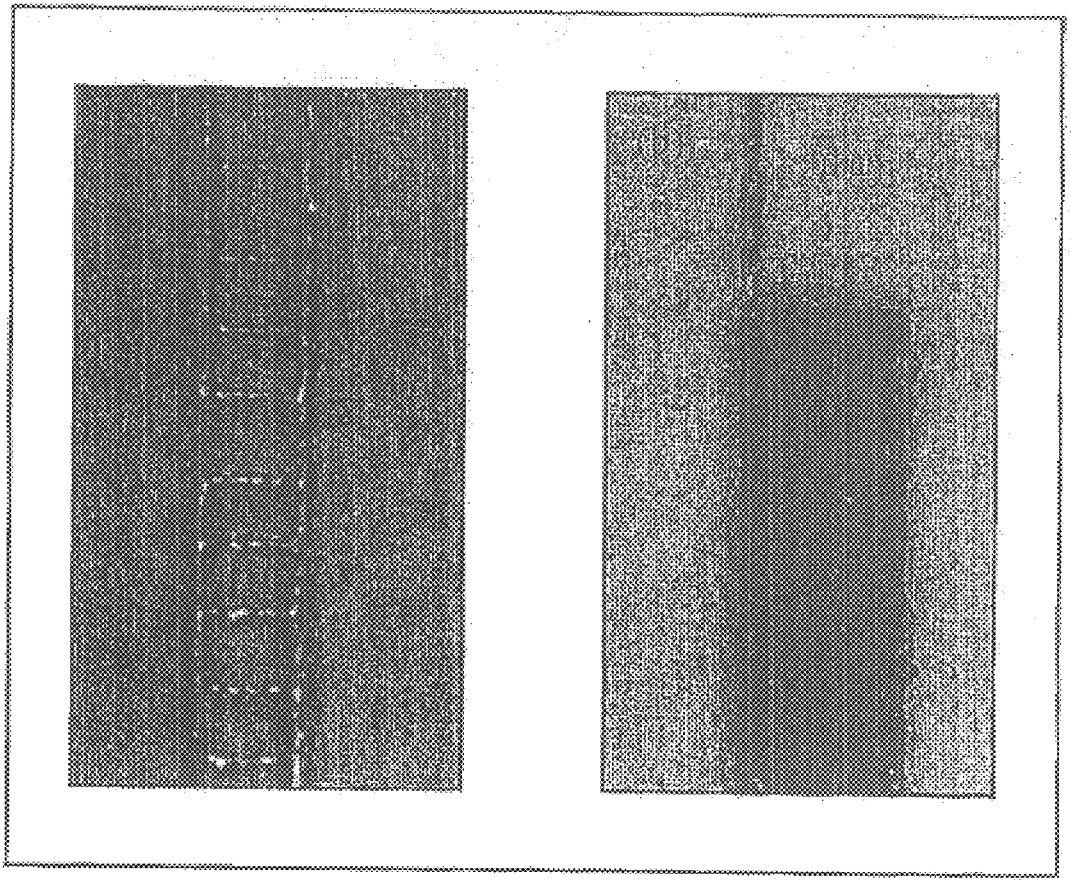

As shown in FIG. 5, experimental patterning results are shown for salt (NaCl) crystallites guided by a diode laser onto a glass cover slip by the apparatus described above and depicted in FIG. 4. In that experiment, a 250 mW laser beam at 800 nm wavelength (λ) was coupled into an fiber 8 mm long, having an inner hollow core diameter of 20 μm. In other successful direct writing experiments, a 400 mW laser beam, λ=800 μm was used. NaCl crystals were dissolved in distilled water to form a saturated solution 60. The droplets of the solution 60 were launched into the laser beam 46 by the nebulizer 54. Since optical forces are a strong function of particle size, scaling approximately as the square of particle size, the largest droplets 52 are preferentially captured and guided into the fiber 50. As the droplets begin to propagate along the fiber 50, the water in the droplets evaporates after about 2 mm of travel into the fiber 50, so the solid NaCl crystals 59 are formed and then guided along the rest of the fiber 50 onto the glass cover slip 58.

Direct "Writing" of Micron-Size Features On Substrates with Laser-Guided Particles As seen in FIG. 5, the first two patterns 66 & 68, respectively correspond to a single NaCl crystallite guided and delivered to the glass surface of substrate 58 in FIG. 4. The other three patterns 70, 72 & 74 in FIG. 5 correspond to structural features formed by multiple NaCl crystallites 59. The spot diameter of each pattern is about 5 $\mu$m, which is significantly smaller than the 20 $\mu$m diameter of the inner hollow core of the guiding fiber. This observation confirms the fact that the radial optical forces confine the crystallites 59 to the center of the hollow core 48. It was estimated that the size of each crystallite 59 is about 1 $\mu$m for a saturated NaCl solution 60. The size of a crystallite 59 on a substrate 58 can be reduced by reducing the concentration of NaCl in the initial solution 60.

Another experimental example of direct writing presents patterns of $BaTiO_3$ $In_2O_3$, Ag, aluminum nitrate ($Al(NO_3)_3$), and aluminum oxide ($AL_2O_3$) crystal depositions, which are shown in FIGS. 6a through 6e, respectively. The lines of crystals in FIGS. 6a through 6e were drawn at various micrometer translation rates during the deposition. The $BaTiO_3$ crystals were guided by a 1 Watt laser at $\lambda$=532 nm, transported through a 14 $\mu$m diameter fiber, four millimeters long.

Fabrication by Directed Particle Deposition

By directing particles along the fiber 50 onto the substrate 58 shown in FIG. 4, micron-size features of desirable shape can be fabricated. As noted above, the direct deposition of nanometer-size particles, called "nano-fabrication," allows a user to build features of dimensions less than 100 nm on a substrate, which is currently the smallest feature achievable in photo-lithographic processes. Such features are built up by continued addition of particles, which can be fused together on substrate 58 by various techniques. These include 1) in-flight melting of the particles and subsequent coalescence of molten droplets on the substrate, 2) simultaneous deposition of solid particles and liquid precursors, wherein the liquids serve to fill the gaps between solid particles, 3) coalescence of liquid precursors on the substrate and subsequent decomposition by laser treatment to form the final product on the substrate, 4) sintering of the deposited material by laser, and 5) chemical binding. The structural features can be composed of a wide variety of materials, such as metals, semiconductors, and insulators.

The current invention makes it possible to create surface structural features less than a micron in size. It is, therefore, possible to increases the density of electrical circuits on a printed board by means of the invention. Circuitry can be "written" on substrates made of plastics, metals, ceramics and semiconductors with the wide range of materials described above. Circuits can be deposited on such substrates with high throughput. Another implementation of laser-guided directed material deposition is the direct-write process on an arbitrary shaped substrate. This process allows the circuitry to conform to the shape of the substrate. Direct writing of micron-sized structural features can be used to print unique identification markers. Manufacturing prototype micro-electronic mechanical devices in the rapidly growing micro-electronic mechanical systems (MEMS) industry is a further use of the invention. Since the direct writing technique can be used to print electrical circuits on a virtually unlimited variety of substrates, the products for which the technique can be used include wireless communication devices, "smart" credit cards, and embedded circuitry in biological implants.

Electrical circuit fabrication which calls for fully dense, continuous, micron-size patterns, can be achieved by the present invention using the direct-write laser-guidance method. In one preferred embodiment, particles melt during laser transportation, so the molten particles flowing together onto the substrate are deposited there as fully dense patterns. A high laser intensity of $10^{12}$ Watts per square meter (W/m$^2$) at the fiber entrance can melt nearly any material by laser light absorption. Strongly absorbing materials, such as metals and alloys will melt at a lower power of about 100 mW within the first 100 $\mu$m of the fiber entrance. To melt weakly absorbent materials, such as transparent glasses and ceramics, a laser emitting in the material's absorption band or a more intense laser is usually required. In the apparatus depicted in FIG. 4, the length of fiber 50 or the optical coupling mode can be adjusted, so that entering particles 52 melt at fiber entrance 56, but the laser intensity at a fiber exit such as at substrate 58, is sufficiently low to minimize heating of substrate 58. Such low exiting intensity can be achieved by the appropriate choice of the length and diameter of the guiding fiber.

Depositions Using Precursors

An alternate method of depositing materials onto a substrate is by use of precursors in depositions. In the laser material deposition method of the present invention, the desired product is a material to be deposited on the substrate. For example, silver nitrate is a salt that dissolves in water. Therefore, laser guiding the droplets of the silver nitrate inside an optical fiber heats the droplets confined in the laser beam, yields the final material, silver. The silver is then deposited on the substrate. Alternatively, heating of the droplets can be accomplished by any other conventional means. Heating and decomposing indium nitrate is another example of using precursors in laser deposition. Guiding and heating indium nitrate in the laser beam inside an optical fiber decomposes to a transparent semiconductor, indium oxide.

Yet another way of depositing a desired material on a substrate is by laser guidance of a liquid droplet which transports a small, solid particle. During transportation, the liquid droplet evaporates, exposing the small solid particle, which is then deposited onto the substrate. In many cases it is easier to guide and deposit precursors rather than the final desired materials.

A list of preferred precursor materials for electronic applications appears in Table Two.

TABLE TWO

| Material | Precursor |
| --- | --- |
| Cu | Copper formate |
| Pt | Platinum tetrachloride |
| Au | Gold chloride, gold thiolate |
| Ag | Silver trifluoroacetate |
| Ni | Nickel formate |
| Zn | Zinc formate |
| Rh | Rhodium chloride |

Laser Levitation of Particles

The same principle on which apparatus 44 in FIG. 4 is based is used to provide an apparatus and method for laser levitation of individual crystallites. If a particle 52 is guided along the vertically disposed fiber 50 in FIG. 4, the force of gravity pulls the particle 52 down. while the axial optical force pushes the particle up the length of the fiber 50. Since the axial force becomes smaller with distance along the fiber, the two forces eventually balance each other and the particle remains levitated at an equilibrium height. When the particle is in equilibrium, the magnitude of the axial force propelling the particle 52 upward is equal to the magnitude of the gravitational force pulling the particle down. The apparatus 44 can serve as a device for measuring the axial force of propulsion since the magnitude of the gravitational force is easily calculated.

Figure 7:
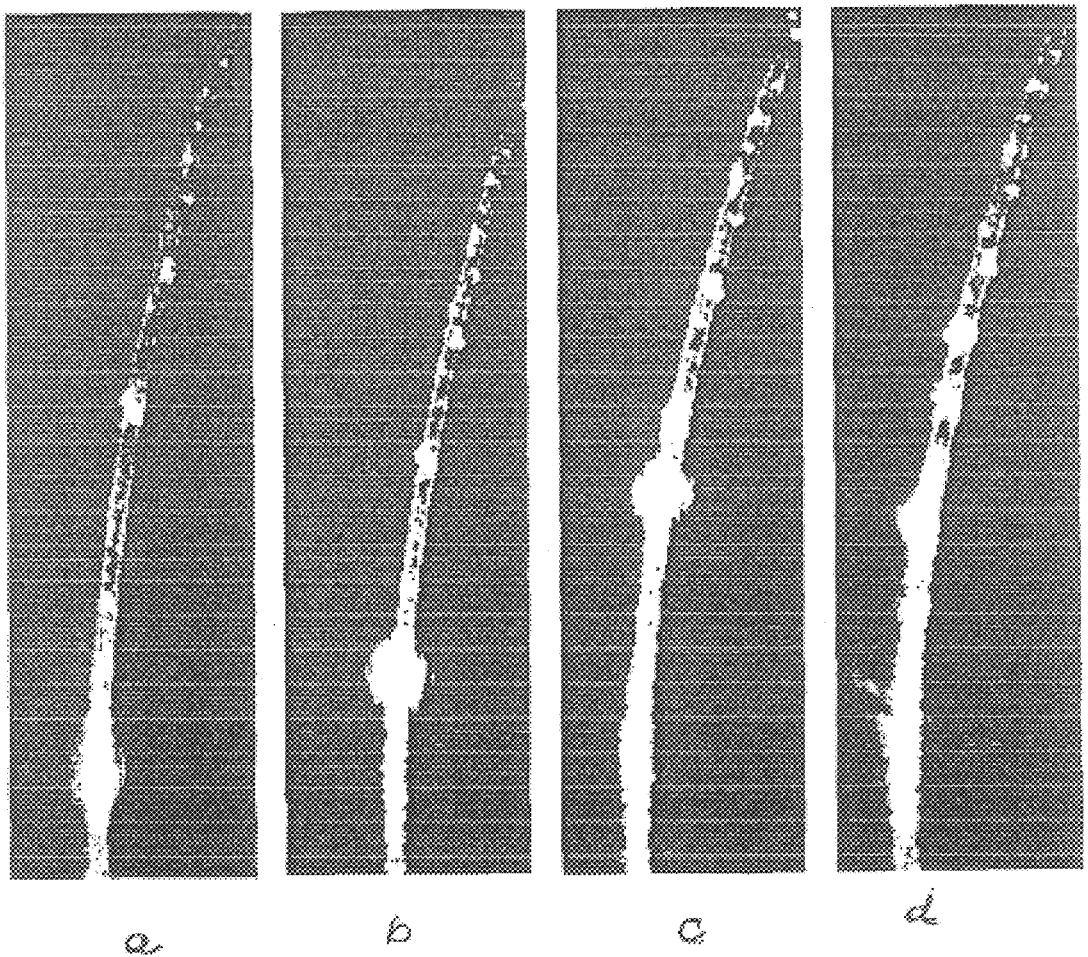
FIGS. 7(a)–(d) are photographs showing levitation of a water droplet in a curved section of an air-filled optical fiber.

The photographs in FIGS. 7 (*a*)–(*d*) show the levitation of a five micrometer water droplet in a five millimeter curved section of an air-filled fiber. A 240-milliwatt laser operating at a wavelength of 800 nanometers is coupled with 90% efficiency to the fiber in the lowest-loss mode. Five micrometer diameter water droplets, (whose size is estimated by optical microscopy), are funneled into the fiber by the laser light radiating through a fog of droplets. The scattered light from the droplet is easily seen by the naked eye in FIGS. 7*a*–*d*, as the droplet travels through the fiber.

Laser Traps

Figure 8:
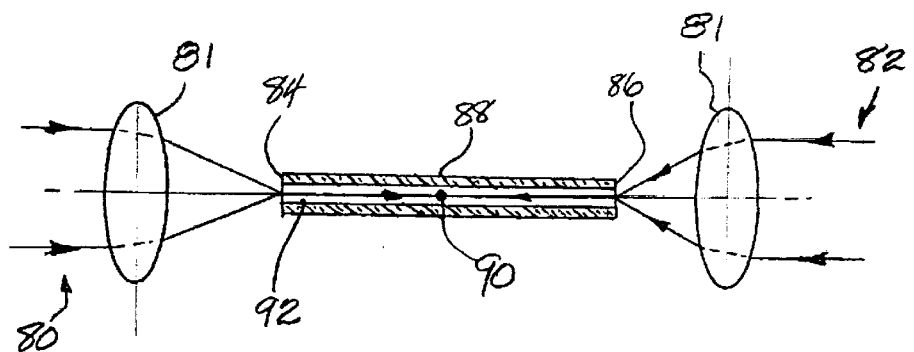
FIG. 8 is a schematic representation of a two-laser trapping apparatus.

Another embodiment of a laser levitation apparatus is shown in FIG. 8. In that embodiment, laser beams 80 & 82 are focused through lenses 81 into entrance faces 84 & 86 at opposite ends, respectively, of a fiber 88. The axial forces exerted on a particle 90 from laser beams 80 and 82 inside a hollow core 92 of fiber 88 are opposite, creating an equilibrium point on a particle 90 inside the fiber. At the same point, the force confining the particle 90 to the center of hollow core 92 doubles in magnitude. By reducing the laser intensity, particle 90 is pulled down by the gravitational force toward the lower part of the hollow core 92. Since the gravitational force can be easily calculated, measurements of the particle's downward displacement provides a measure of the radial confinement force.

Laser traps for confining liquids, salts, glasses and metals, similar to the kind depicted in FIG. 8, have been constructed and tested for several hours while monitoring the particles' dynamic behavior and light scattering. By mixing droplets in such traps, chemical reactions were observed during the mixing process. Such an apparatus is useful for "containerless" processing of chemicals. Droplets are mixed by laser-heating or coalescence while confined in the laser beam.

Figure 9:
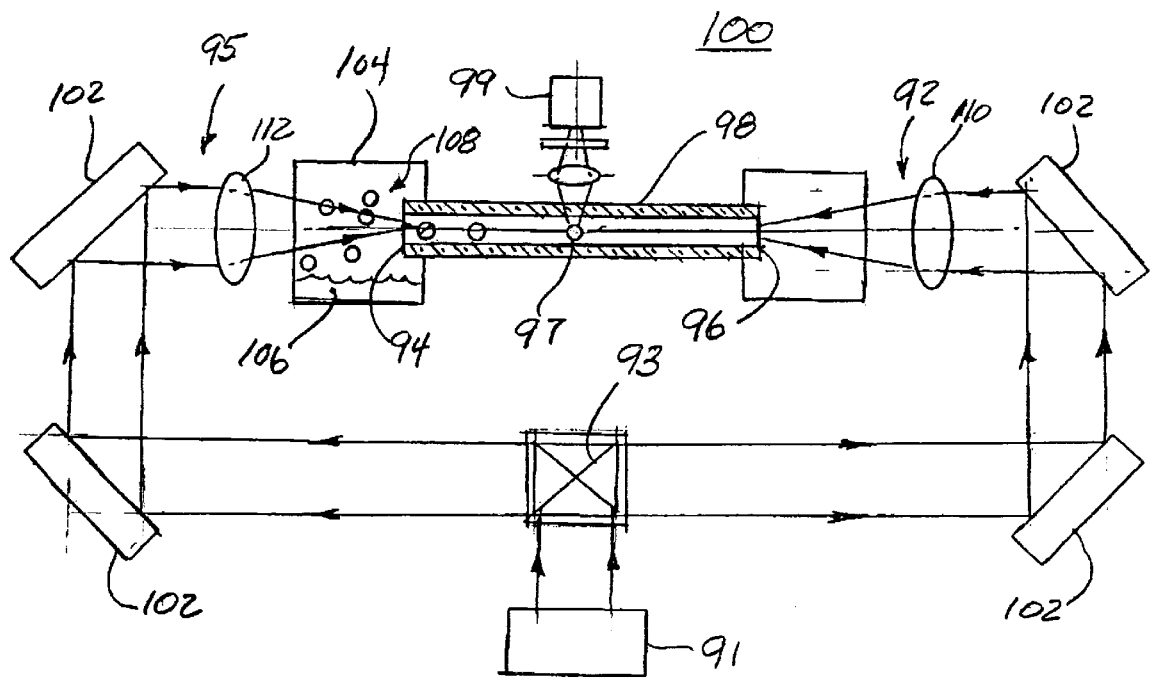
FIG. 9 is a schematic representation of another embodiment of a two-laser trapping apparatus.

Another application of a two-beam laser trap is an apparatus 100 for recording the emission spectrum of trapped particles. The apparatus is shown schematically in FIG. 9. The trap is formed by laser beams 92 & 95 directed into opposite ends 94 & 96 of a hollow fiber 98. The laser beams 92 & 95 are formed by a beam splitter 93, which splits a laser beam generated by a source 91. The beams 92 & 95 are redirected by folding mirrors 102 and focused on the fiber ends 94 & 96 by lenses 110 & 112. A particle mist 108 is generated in chamber 104, which contains a solution of the material of interest. At a point inside fiber 98, optical forces from laser beams 92 and 95 balance and the laser field confines and heats the particles 97 inside the fiber 98. Optical emission spectrum of the trapped particles 97 is then recorded by a low light spectrophotometer 99.

Two-beam, laser trap apparatus 100 can be a useful tool in controlling fully-dense, direct writing and adhesion of particles to a substrate. The combined use of emission spectrum and light-scattering patterns of a particle will distinctly determine the melting temperature and conditions for controlling direct laser writing. The conditions for melting are determined by measuring the particle's temperature from its radiative emission and by measuring the temperature's dependence on material, particle size, laser power and hollow fiber dimensions. The particle's phase transition between solid and liquid is determined from the changes in optical scattering patterns.

Fabrication by Laser Depositions of Particles Using a Hybrid System

Figure 10:
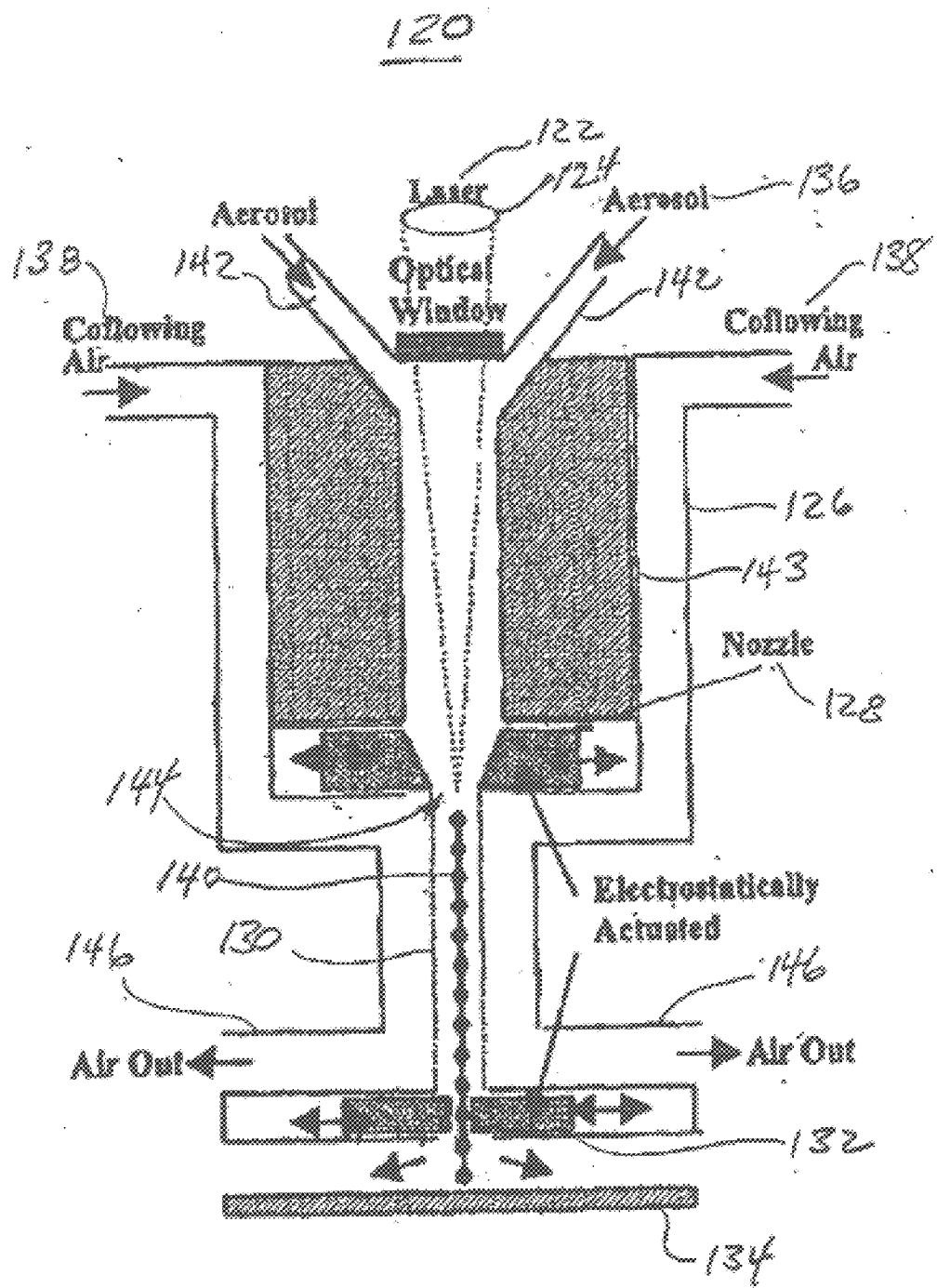
FIG. 10 is a schematic sketch of a particle deposition apparatus using a laser and co-flowing air column to propel the particles.

FIG. 10 reveals a hybrid apparatus 120 for low-cost fabrication of micro-electronic-mechanical systems using fluid-guided particles in a cytometeric-type flow in a hollow container 143. Fluid forces propel a flow of aerosol particles 136 axially through the apparatus 120. The fluid forces are higher than optical forces produced by a laser beam 122. However, the optical forces on the particles 142 move them toward the center of the laser beam 122. The forces are great enough to keep the particles 136 from reaching the walls of the chamber 143, precluding clogging. In this apparatus 120, the flow of aerosol droplets 136, carrying particulate or precursor material, is admitted into the chamber 143 through inlets 142 at the chamber top. The laser beam 122 is passed through the chamber 143, focused by a lens 124 on a nozzle orifice 144 of a variable nozzle 128 in the outlet of the chamber 143. As earlier described, the aerosol droplets 136 are drawn into the laser beam but propelled with high velocity through the nozzle orifice 144 toward a substrate 134 by the entraining fluid. The nozzle orifice 144 is adjustable, preferably electrostatically, depending on the size of a feature to be deposited on the substrate 134. On the way to the substrate 134, the aerosol particles 136 are treated by laser heating. The laser beam 122 evaporates the aerosol droplets 136, leaving crystals or thermally coalesced particles 140 which are subsequently deposited on the substrate 134. The laser beam 122 can be used to treat the particles 140 "on the fly" or after deposition on the substrate 134. This technique is further discussed below. The deposition continues according to a desired pattern to create useful three-dimensional structure.

A hollow column of co-flowing air 138 surrounds the stream of particles 140 in a sheath, forming a barrier 130 and focusing the particles 140 on a second nozzle 132 orifice. The second, adjustable orifice 132 is placed near the substrate to control the flow of particles 140 to the substrate for deposition and divert air flow away from the deposition. The co-flowing air 138 is led away from the deposition through air outlets 146. The flow rates of the aerosol droplets 136 and the co-flowing air 138 are adjusted so their velocities are the same at and below the nozzle orifice 144.

Laser-Guided Depositions Using Liquid/Aerosol Jetting Technique

Figure 11:
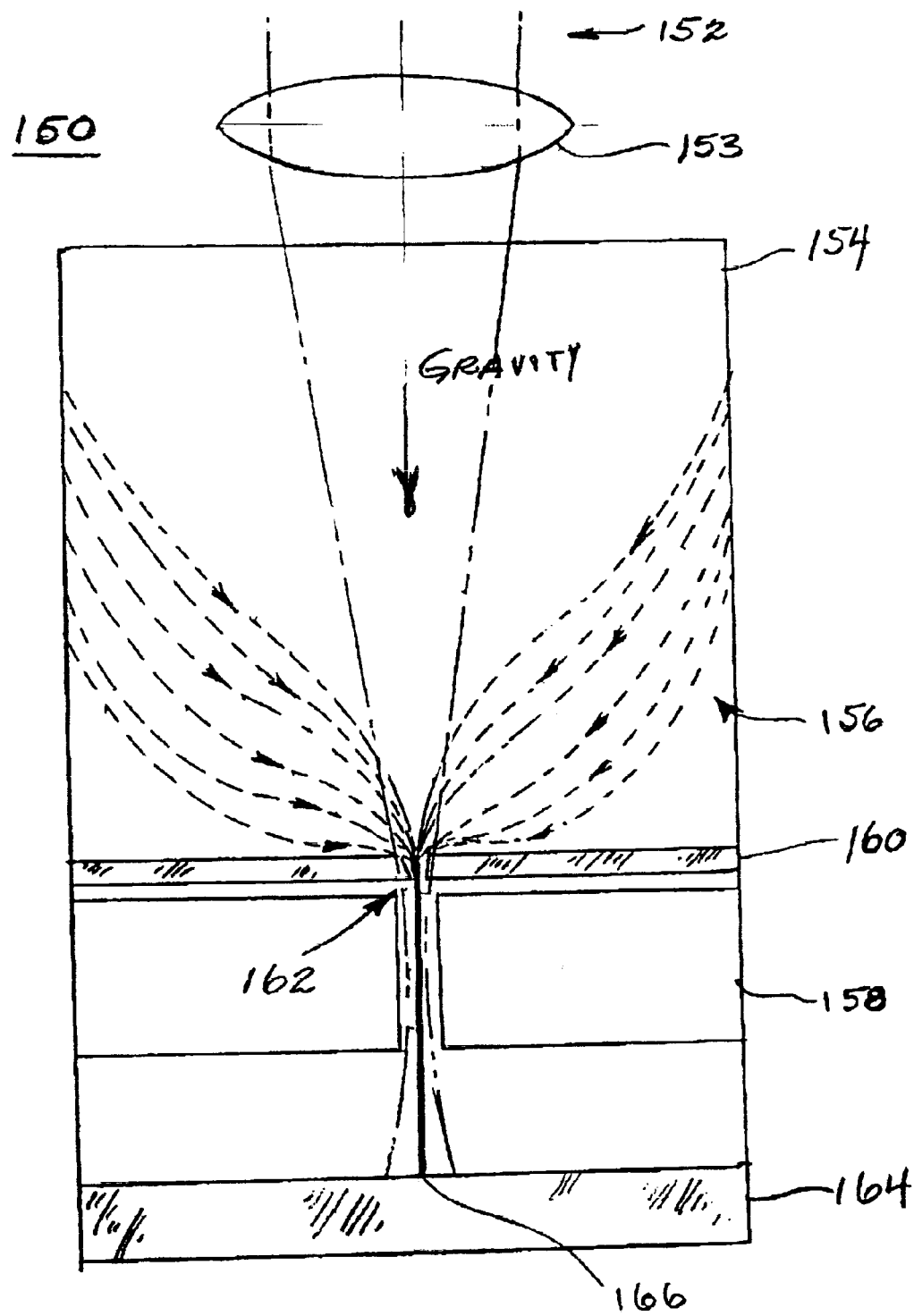
FIG. 11 is a schematic, side elevation view of an aerosol-jetting deposition apparatus for material depositions.
Figure 17:
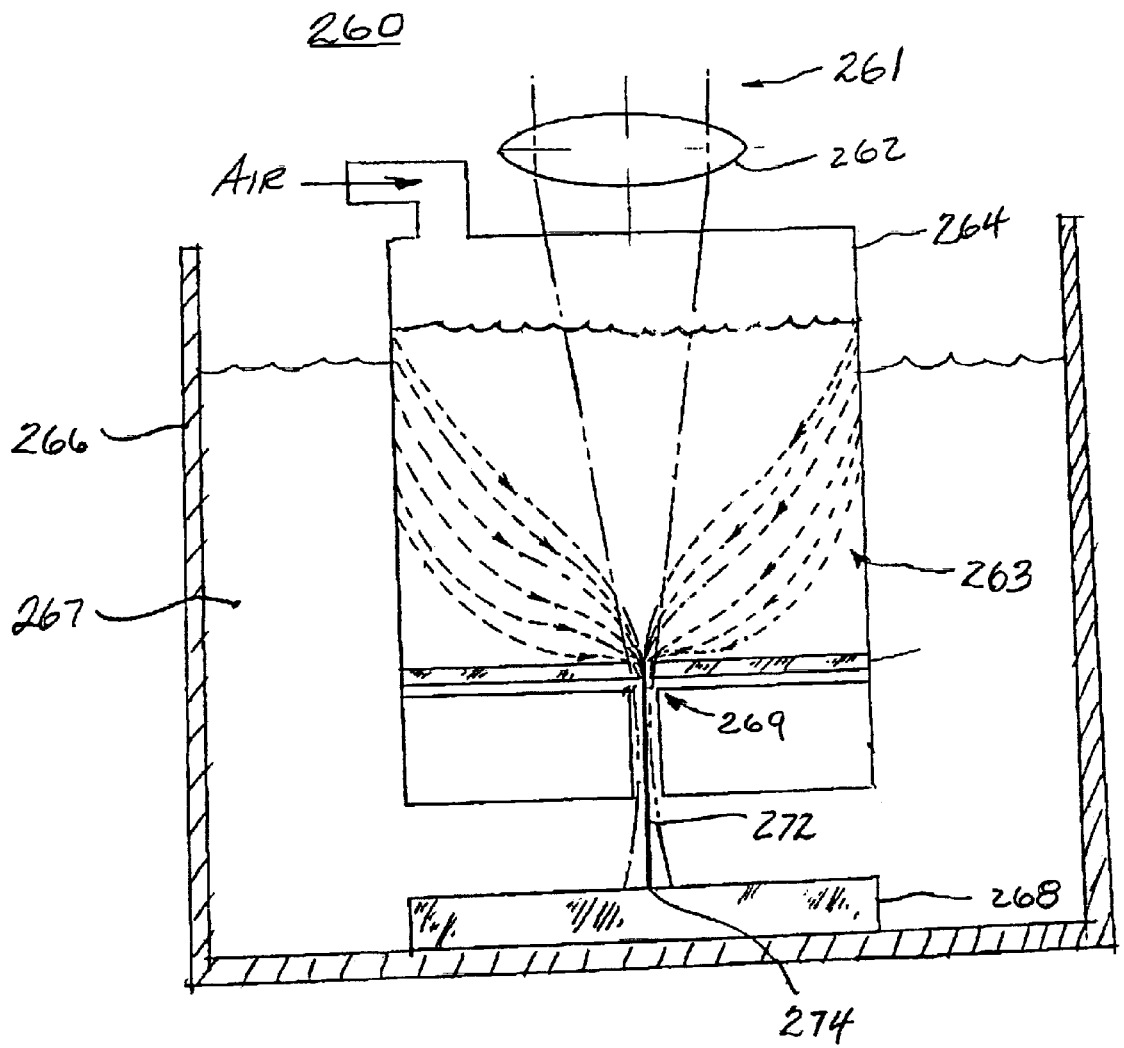
FIG. 17 is an elevation schematic rendering of apparatus for forming structures using laser guidance and liquid jetting, particularly useful in transporting living cells to a substrate.

FIG. 11 illustrates an aerosol-jetting deposition apparatus 150 for material depositions. The apparatus 150 is particularly useful in transporting living cells to a substrate where they can be nurtured and grown. Container 154 is filled with aerosol material or particles suspended in a liquid (156). When transporting living cells to a substrate 164, a laser beam 152 is unable to apply much force to a cell. This is because living cells usually have small light deflection. A desirable speed for the particle stream is of the order of 1 meter per second at the substrate 164, but a laser beam 152 intense enough to achieve this velocity would likely destroy or damage the cells. Therefore, to move such cells at a high velocity and speed-up the deposition process, a co-flowing fluid (156) is needed. Additionally, living cells should be constantly immersed in a life-supporting fluid even after deposition on the substrate 164. FIG. 17 also illustrates this process.

The laser beam 152 is useful in guiding living cells and similar particles to the center of the channel 158 which directs them to the substrate 164. The beam 152 is also used to hold the cells to the substrate long enough for them to adhere at the surface 166, else they would be swept away in escaping fluid.

In FIG. 11, the fluid flow 156 is forced through a pinhole 162 in an orifice plate 160 at the bottom of the container 154. Fluid forces propel the particulates in the fluid toward the substrate 164. The orifice plate 160 is transparent to the laser beam 152 so the beam 152 can treat the particles on the fly or after deposition on the substrate 164.

Laser-Guided Material Deposition Methods Using Treatable and Treated Particles Laser guided manipulation methods for depositing materials on a substrate disclosed in the present invention can be further extended by treating the deposited particles with an energy source. The energy source may be a heat source, another laser beam or the deposition laser beam itself.

Figure 12:
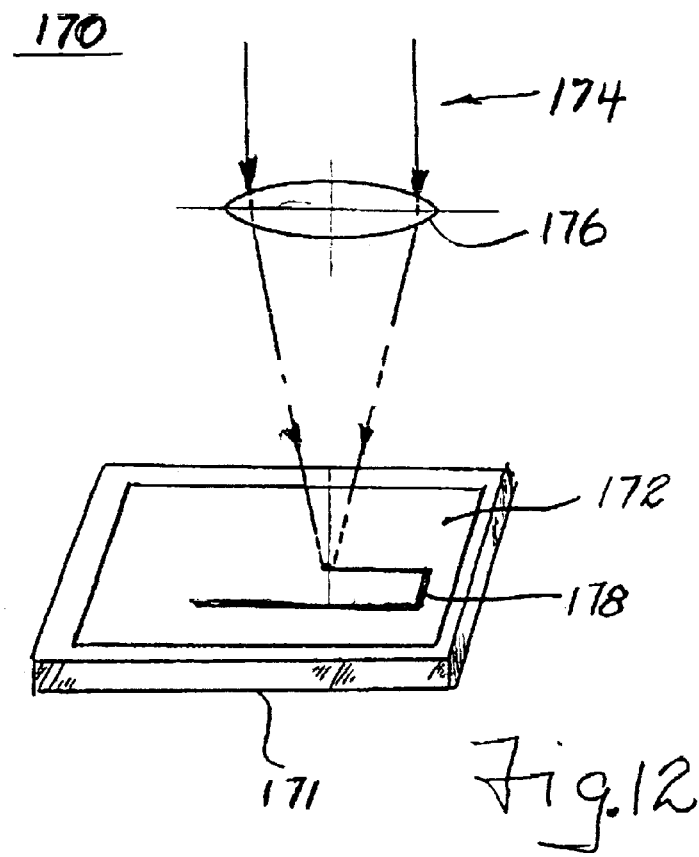
FIG. 12 is a perspective view, schematically shown, of a general method of laser light treatment of deposited particulates.

FIG. 12 depicts a method of treating deposited materials 172 on a substrate 171 with a laser beam 174, after an original deposition 172 by, for example, direct writing as described above. Laser beam 174 is directed through a focusing lens 176 onto the treatable, deposited material 172. A line of treated material 178 is created by scanning the laser beam 174 in a desired pattern. Untreated, deposited material 172 is then removed by a solvent or mechanical means. Repeating the deposition, treatment and removal of material produces three-dimensional structures. These structures may be formed from a plurality of different materials.

Figure 13:
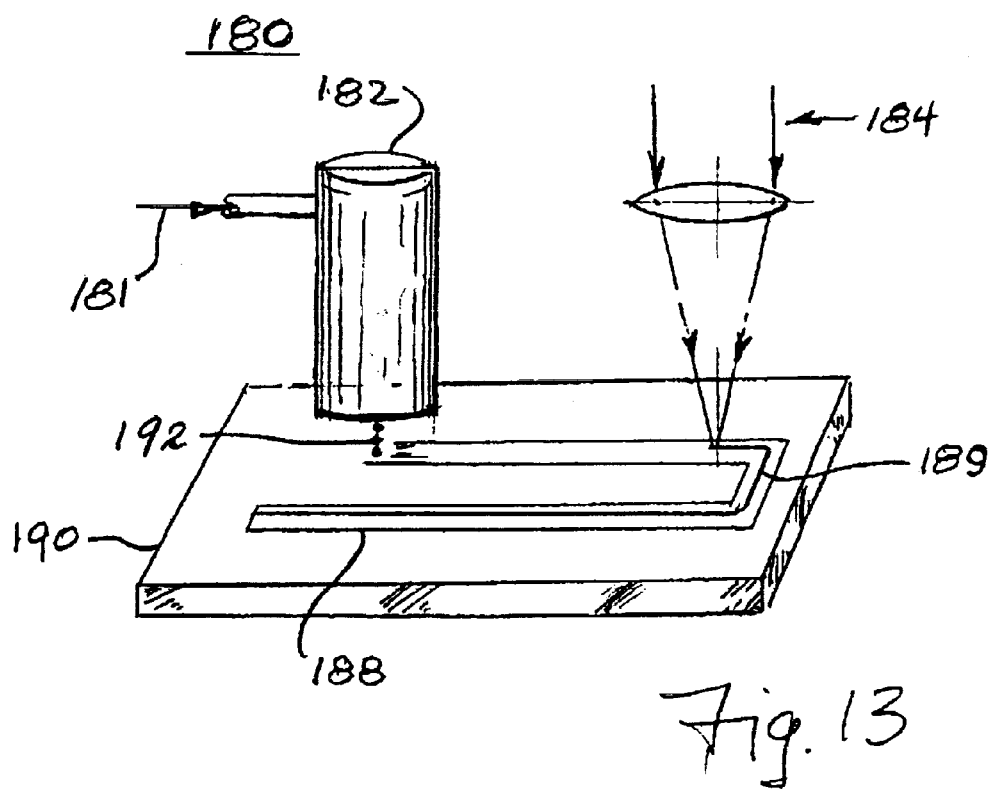
FIG. 13 is a perspective view of another apparatus for treating deposited particulates.

FIG. 13 depicts an alternative method of treating deposited materials 188 on a substrate 190. In this alternative, particles 192 are deposited by means of an aerosol jet from an aerosol jetting apparatus 182, such as described above, conventional spin coating, jetting or similar techniques. As in FIG. 12, an intense optical source, such as a focused laser beam 184, is scanned over the treatable, deposited material 188 following deposition. The substrate 190 may be composed of ceramic, polymer, paper, circuit board, glass, semiconductor, metals, to name a few materials. The deposition particle 192 may be a metal salt, a metal salt dissolved in solvent, a solid particulate such as a metal, a dielectric, a semiconductor, a polymer or a solid particulate suspended in a liquid, or a liquid polymer incorporating particulates. Solvent evaporation, leaving the treated particulate 189, is facilitated by the laser 184 heating the deposited material 188. Alternatively, thermally-initiated cross-linking forms the treated material 189.

Simultaneous Deposition and Treatment of Particulate Material

Figure 14:
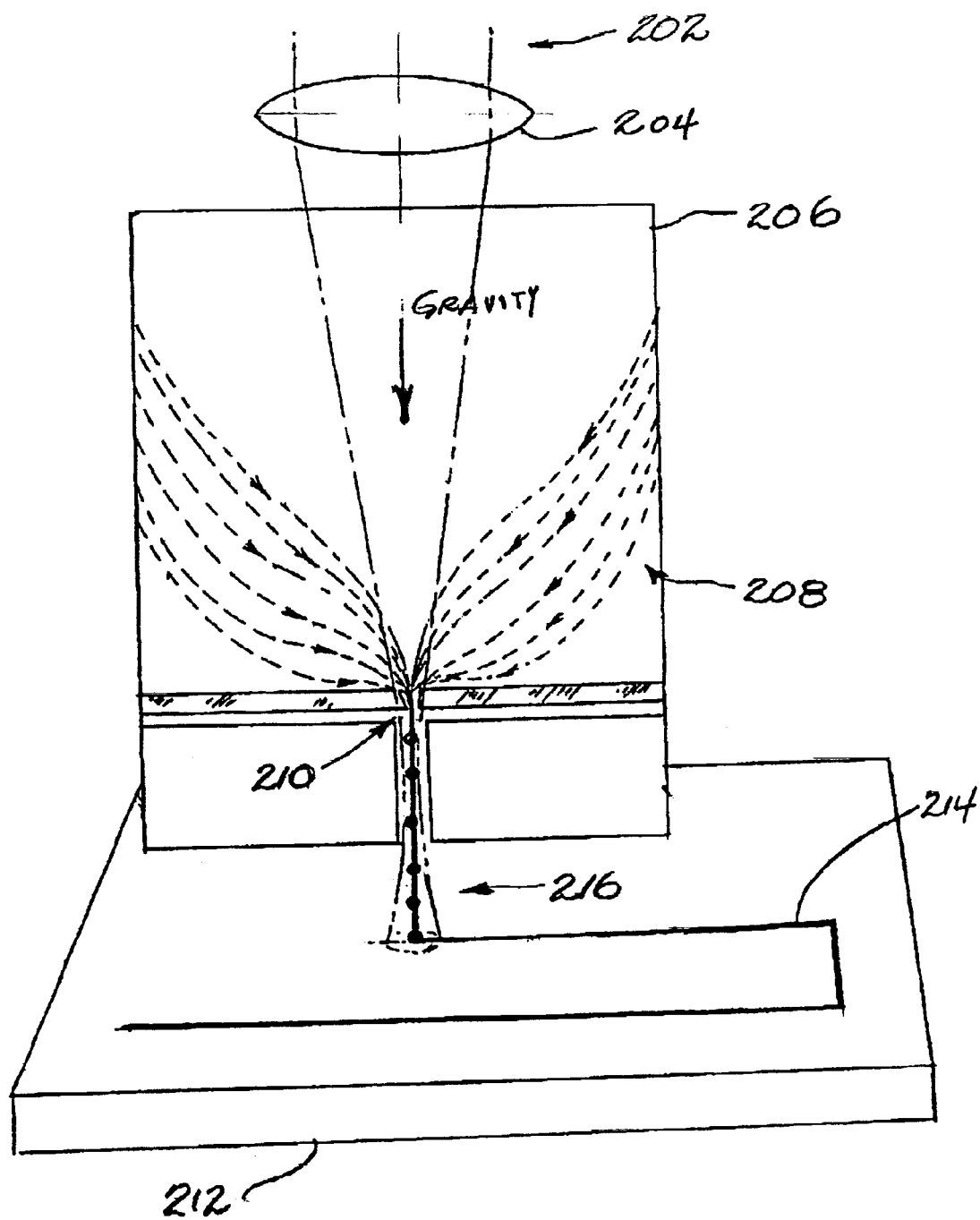
FIG. 14 is a schematic of an aerosol jetting, particle deposition apparatus revealing treatment of the deposition by an integral laser.

By use of the apparatus 200 described in FIG. 14, a large step is eliminated in the process of depositing particles on a substrate for fabrication of three-dimensional structures. With this apparatus 200, the deposition of particles from an aerosol source 208 is guided to the substrate 212 by aerosol deposition apparatus 206, similar to that first described above and presented in FIG. 11. The laser beam 202, focused by lens 204 on the orifice 210 of the aerosol deposition apparatus 206, not only keeps the aerosol droplets 216 centered in the beam on the way to the substrate 212, but the laser beam 202 is also used to treat the deposited material 214. Such treatment can take place while the particles 216 are "on the fly" or when they impact on the substrate 212 surface. Treatment may be particle melting, decomposition, sintering or other chemical and mechanical reactions caused by the laser's interaction with the particle 216. The resulting, treated depositions have desirable mechanical and electrical properties for electronics and micro-electronic mechanical system applications.

Direct-Writing and Treating Materials Using Temporary Support

Figure 15:
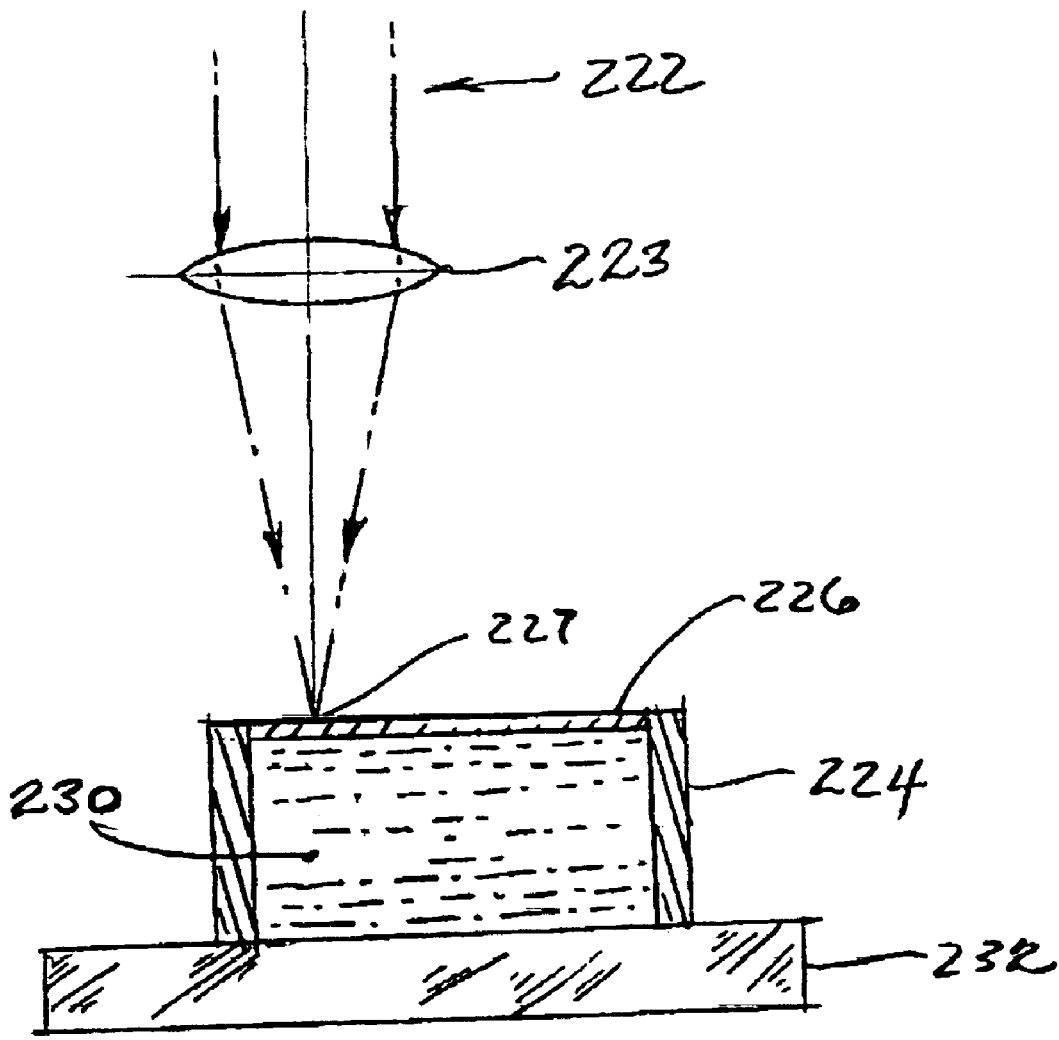
FIG. 15 is a side elevation view of a method of direct writing and treating of materials on a temporary substrate or support.

FIG. 15 provides an illustration of a method of direct writing and treating of materials on a temporary substrate or support. A laser particle deposition apparatus 120, such as described in FIG. 10 may be used to form a structure 224 which is used as base for new depositions of treatable material 226 and a container for a soluble support material 230. The support material 230 may be deposited by conventional or laser-guided means, then solidified by chemical, thermal, or optical means. A support material 230 may be an ice, a crystalized salt, or a solidified liquid polymer, among many other possible types. The treatable material 226 is deposited on the support material 230. Then, using laser 22 focused by lens 228, the treatable material 226 is laser treated as described earlier to form dense, connected and/or ductile material structures 227. The support material 230 is then removed by a suitable solvent or procedure.

Figure 16:
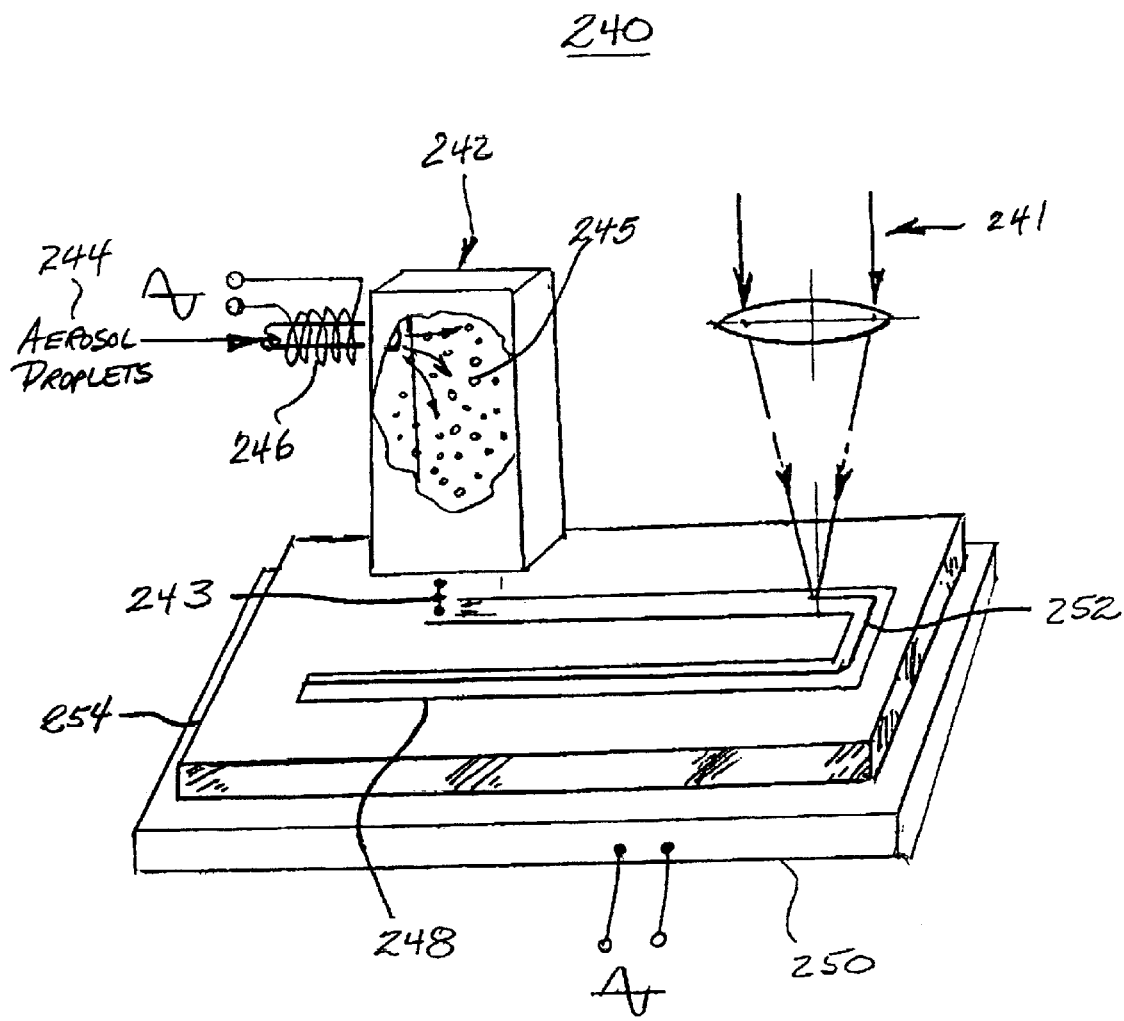
FIG. 16 is a schematic perspective view of a method of controlling the energy required to treat materials deposited to form three-dimensional structures.

Controlling the Energy Required to Treat Materials Deposited to Form Three-Dimensional Structures In forming three-dimensional structures of laser-deposited materials, it is sometimes useful to reduce the laser power needed to treat the deposited material during or after deposition. For example, an inexpensive laser diode might be used for the treatment process if most of the energy necessary for such treatment were supplied by another means. An apparatus 240 for doing that is described by FIG. 16. In this alternative embodiment of the laser-manipulation invention, a stream 244 of aerosol droplets 246 is introduced into the laser deposition apparatus 242 after passing through a heater 246 which pre-treats the aerosol droplets 245, drying and or partially decomposing them. The laser-deposition apparatus 242 is patterned after the one shown in FIG. 11 which employs a co-flow fluid to propel the particles 245 through a small orifice toward a substrate 254. A pre-treated deposit 248 is therefore laid on the substrate 248. The substrate 254 is itself conditioned with a substrate heater 250. Because the deposition 248 is heated to a pre-treatment state and temperature conditioned by the substrate heater 250, an infrared lamp or a high power diode laser, only light from a low energy laser beam 241 is needed for completion of the treatment. Fully treated material 252 is formed by scanning the laser beam 241 over the substrate 248 in a desired pattern. The steps are repeated to produce a structure in three dimensions. In the example shown in FIG. 16, a treatable platinum deposition is prepared from water-soluble platinum tetrachloride. By pre-heating droplets 245 of platinum tetrachloride as they enter the deposition apparatus 242, and then raising the temperature of the deposited material to near 580 degrees Celsius with the substrate heater 250, a low-power, diode laser can complete the decomposition of a desired deposition pattern 252 to pure platinum.

In electronics applications, besides platinum tetrachloride, preferred laser-treatable materials are: gold tetrachloride, copper formate, silver acetate, silver nitrate, barium titanate and aluminum oxide. The minimum size of a treated region is about one micrometer.

Forming Deposited Structures Using Laser Guidance and Liquid Jetting

In previous discussion above, it was noted that certain cells, among them living tissue, should be constantly immersed in a supporting fluid even after deposition on a substrate. The apparatus 260 shown schematically in FIG. 17 is designed to fill this need. An inner chamber 264 is disposed in a fluid-filled, outer chamber 266.

The outer chamber 266 contains fluid media 267, including in the case of deposited living cells, nutrients necessary for growth. Other fluids may be selected to treat inorganic materials such as metals or plastics. The inner chamber 264 contains a fluid containing dissolved or suspended particulates 263. Pressurization of the inner chamber 264 with air or other fluid flow propels a stream containing particulates 272 through a small orifice 269 in the inner chamber toward substrate 268 which is immersed in the first chamber fluid media 267. A laser beam 261 holds the particles 272 in place on the deposition footprint 274, on the substrate 264 and treats them as needed by decomposition or other chemical and mechanical reactions possible with laser-particle interaction.

CONCLUSION

Although the present invention has been described in detail with reference to particular preferred and alternative embodiments, persons possessing ordinary skill in the art to which this invention pertains will appreciate that various modifications and enhancements may be made without departing from the spirit and scope of the Claims that follow. The various configurations that have been disclosed above are intended to educate the reader about preferred and alternative embodiments, and are not intended to constrain the limits of the invention or the scope of the Claims. The List of Reference Characters which follows is intended to provide the reader with a convenient means of identifying elements of the invention in the Specification and Drawings. This list is not intended to delineate or narrow the scope of the Claims.

LIST OF REFERENCE CHARACTERS

FIGS. 1 & 2

10 Laser beam ray
12 Dielectric, spherical particle
14 Surface of the sphere
16 Point on the surface of the sphere at which ray enters
18 Point on the surface of the sphere at which ray exits
20 Centerline of laser beam incident on a hollow optical fiber
22 Hollow optical fiber
24 Bore of the optical fiber
r Radius of sphere
$\rho$ Radial distance from laser beam center line to center of sphere
$\rho_0$ Radius of the bore of a hollow optical fiber
$F_1$ Optical force due to refraction of ray when entering sphere
$F_2$ Optical (radiation pressure) force due to reflection of ray when entering sphere
$F_3$ Optical force due to refraction of ray when leaving sphere
$F_4$ Optical force due to reflection of ray when leaving sphere
$\eta_f$ Index of refraction of the hollow optical fiber
$\eta_m$ Index of refraction of medium surrounding sphere
$\eta_s$ Index of refraction of sphere

FIG. 3

30 Chart of optical forces on a dielectric particle having a radius larger than the wavelength of an illuminating laser
40 Radial gradient force
41 Optical force in $10^{-11}$ Newtons
42 Axial force in $10^{-11}$ Newtons
43 Radial position of the dielectric particle in micrometers

FIG. 4

44 Laser guidance of particles and surface patterning apparatus
46 Laser beam
48 Bore of hollow optical fiber
50 Hollow optical fiber
52 Particle
54 Nebulizer
56 Entrance aperture of hollow fiber
57 Shield
58 Substrate
59 Solid crystallite particles
60 Sodium chloride (NaCl) dissolved in water ($H_2O$)
62 Aerosol mist
64 Focusing lens

FIG. 5

66, 68 Single NaCl crystal laser-guided to a glass substrate
70, 72 Structural feature formed by multiple NaCl crystals
74 Structural feature formed by multiple NaCl crystals

FIG. 8

80 First laser beam
81 Focusing lens
82 Second laser beam
84 L. H. entrance face of hollow optical fiber
86 R. H. entrance face of hollow optical fiber
88 Hollow optical fiber
90 "Levitated" particle
92 Bore of hollow optical fiber

FIG. 9

91 Laser source
92 R. H. Laser beam
93 Beam splitter
94 L. H. entrance face of hollow optical fiber
95 L. H. Laser beam
96 R. H. entrance face of hollow optical fiber
97 "Levitated" particle
98 Hollow optical fiber
99 Spectrophotometer
100 Two-beam laser trap apparatus
102 Folding mirror
104 Aerosol chamber
106 Liquid with dissolved or suspended particles
108 Aerosol mist
110 R. H. Focusing lens
112 L. H. focusing lens

FIG. 10

120 Laser particle deposition apparatus with co-flowing air
122 Laser beam
124 Focusing lens
126 Co-flowing air outer chamber
128 First variable nozzle
130 Air barrier
132 Second variable nozzle
134 Substrate
136 Aerosol droplet flow
138 Co-flowing air
140 Particle
142 Aerosol droplet flow
143 Inner chamber
144 First, variable nozzle orifice
146 Outlet air ducts

FIG. 11

150 Aerosol-jetting deposition apparatus for material depositions
152 Laser beam
153 Focusing lens
154 Container may be filled with
156 Aerosol material or suspended particles in a liquid flow 158 Guide channel
160 Orifice plate
162 Orifice
164 Substrate
166 Deposition surface
FIG. 12
170 Method of laser treating deposited materials
171 Substrate
172 Treatable material deposition
174 Laser beam
176 Focusing lens
178 Laser-treated material
FIG. 13
180 Alternative method of treating deposited materials
181 Flow of aerosol particles
182 Aerosol jetting apparatus
184 Laser beam
188 Treatable material
189 Laser treated material
190 Substrate
192 Particle flow
FIG. 14
200 Apparatus for simultaneous deposition and treatment of particulate material
202 Laser beam
204 Focusing lens
206 Aerosol deposition apparatus
208 Aerosol source
210 Orifice
212 Substrate
214 Treated, deposited material
216 Particle stream
FIG. 15
220 Apparatus for direct-writing and treating materials using temporary support
222 Laser beam
223 Focusing lens
224 Deposited structure
226 Treatable material
230 Support material
232 Substrate
FIG. 16
240 Apparatus for controlling energy required to treat deposited materials
241 Laser beam
242 Aerosol deposition apparatus
243 Particles
244 Stream of aerosol droplets
245 Aerosol droplets
246 Aerosol pre-heater
248 Treatable deposited material
250 Substrate heater
252 Treated material
254 Substrate
FIG. 17
260 Apparatus for forming structures using laser guidance and liquid jetting
261 Laser beam
262 Focusing lens
263 Dissolved or suspended particulates
264 Inner chamber
266 Outer chamber
267 Fluid media
268 Substrate
269 Orifice
272 Particle stream
274 Deposition footprint

What is claimed is:
1. A method comprising the steps of:
  guiding a particle in an optical conductor, said optical conductor having a hollow portion;
  directing a beam of energy into said hollow portion;
  placing said particle within said beam of energy;
  creating optical forces on said particle by polarizing said particle in an intense optical field of said beam of energy;
  drawing said particle generally toward the center of said beam of energy; and
  propelling said particle along a length of said optical conductor with said optical forces.
2. The method of claim 1 wherein the particle is selected from the group consisting of metals, alloys, semiconductors, plastics, glasses, liquid chemical droplets, liquid droplets containing dissolved or suspended materials, bacteria, viruses, genes, proteins, living cells, and DNA macromolecules.
3. The method of claim 1 additionally comprising the step of ejecting the particle from said optical conductor onto a substrate.
4. The method of claim 3 wherein the ejecting step causes a result selected from the group consisting of fabrication of micron-size surface structures, deposition of materials formed from precursors, deposition in conjunction with heating, and deposition in conjunction with treatment other than heating.
5. The method of claim 3 additionally comprising the step of supplementing optical forces with fluid flow forces.
6. The method of claim 1 wherein said optical conductor is bent or curved.
7. The method of claim 1 wherein said optical conductor transports the particle out of a chamber.
8. The method of claim 1 additionally comprising the step of suspending the particle within said optical conductor.
9. The method of claim 1 wherein said beam of energy is a laser beam.
10. A method comprising the steps of:
  guiding particles into a hollow optical conductor; and
  directing a laser beam into said conductor;
  thereby propelling the particles along a length of said conductor.
11. The method of claim 10 wherein the particles are selected from the group consisting of metals, alloys, semiconductors, plastics, glasses, liquid chemical droplets, liquid droplets containing dissolved or suspended materials, bacteria, viruses, genes, proteins, living cells, and DNA macromolecules.
12. The method of claim 10 additionally comprising the step of ejecting the particles from said optical conductor onto a substrate.
13. The method of claim 12 wherein the ejecting step causes a result selected from the group consisting of fabrication of micron-size surface structures, deposition of materials formed from precursors, deposition in conjunction with heating, and deposition in conjunction with treatment other than heating.
14. The method of claim 12 additionally comprising the step of supplementing optical forces with fluid flow forces.
15. The method of claim 10 wherein said optical conductor is bent or curved.
16. The method of claim 10 wherein said optical conductor transports the particles out of a chamber.
17. The method of claim 10 additionally comprising the step of suspending the particles within said optical conductor.

18. An apparatus comprising:

a laser beam generator;

a hollow optical conductor;

means for introducing particles into said conductor; and means for directing a laser beam generated by said generator into said conductor, thereby propelling the particles along a length of said conductor.

19. The apparatus of claim 18 wherein the particles are selected from the group consisting of metals, alloys, semiconductors, plastics, glasses, liquid chemical droplets, liquid droplets containing dissolved or suspended materials, bacteria, viruses, genes, proteins, living cells, and DNA macromolecules.

20. The apparatus of claim 18 additionally comprising means for ejecting the particles from said optical conductor onto a substrate.

21. The apparatus of claim 20 wherein said ejecting means causes a result selected from the group consisting of fabrication of micron-size surface structures, deposition of materials formed from precursors, deposition in conjunction with heating, and deposition in conjunction with treatment other than heating.

22. The apparatus of claim 20 additionally comprising means for supplementing optical forces with fluid flow forces.

23. The apparatus of claim 18 wherein said optical conductor is bent or curved.

24. The apparatus of claim 18 wherein said optical conductor transports the particles out of a chamber.

* * * * *

UNITED STATES PATENT AND TRADEMARK OFFICE
CERTIFICATE OF CORRECTION

| | | |
|---|---|---|
| PATENT NO. | : 6,636,676 B1 | Page 1 of 1 |
| APPLICATION NO. | : 09/584997 | |
| DATED | : October 21, 2003 | |
| INVENTOR(S) | : Michael J. Renn | |

It is certified that error appears in the above-identified patent and that said Letters Patent is hereby corrected as shown below:

Column 1, line 30, delete "None." and insert the following paragraph:

--The U.S. Government has a paid-up license in this invention and the right in limited circumstances to require the patent owner to license others on reasonable terms as provided for by the terms of Contract Nos. N00014-99-C-0243 and N00014-99-C-0258 awarded by the U.S. Department of the Navy.--

Signed and Sealed this
Eighth Day of March, 2011

David J. Kappos
*Director of the United States Patent and Trademark Office*